United States Patent
Chen et al.

(10) Patent No.: US 10,665,154 B1
(45) Date of Patent: May 26, 2020

(54) ALTERNATING SELF-COMPENSATION CIRCUIT

(71) Applicant: MIKRO MESA TECHNOLOGY CO., LTD., Apia (WS)

(72) Inventors: Shyh-Feng Chen, Hsinchu County (TW); Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/299,157

(22) Filed: Mar. 12, 2019

(51) Int. Cl.
  *G09G 3/32* (2016.01)
  *H01L 27/32* (2006.01)
  *H01L 27/146* (2006.01)

(52) U.S. Cl.
  CPC ........... *G09G 3/32* (2013.01); *H01L 27/3262* (2013.01); *H01L 27/3265* (2013.01); *G09G 2300/043* (2013.01); *G09G 2300/0876* (2013.01); *G09G 2310/0251* (2013.01); *G09G 2310/0267* (2013.01); *G09G 2310/0289* (2013.01); *G09G 2310/062* (2013.01); *G09G 2330/10* (2013.01); *H01L 27/14641* (2013.01)

(58) Field of Classification Search
  CPC ............. G09G 3/32; G09G 2310/0289; G09G 2310/062; G09G 2310/0267; G09G 2310/08; G09G 2310/0251; G09G 2330/10; G09G 2300/043; G09G 2300/0876; H01L 27/3265; H01L 27/3262; H01L 27/32; H01L 27/14641; H01L 25/0753
  See application file for complete search history.

(56) References Cited

U.S. PATENT DOCUMENTS

| | | | |
|---|---|---|---|
| 9,196,196 B2* | 11/2015 | Chung | H05B 45/10 |
| 10,297,197 B2* | 5/2019 | Chung | G09G 3/3233 |
| 2006/0012587 A1* | 1/2006 | Stevenson | G09G 3/3233 345/204 |
| 2015/0116383 A1* | 4/2015 | Kim | G09G 3/3258 345/694 |
| 2017/0148389 A1* | 5/2017 | Zhou | G09G 3/3233 |
| 2018/0025690 A1* | 1/2018 | Bao | G09G 3/3258 345/691 |
| 2018/0342197 A1* | 11/2018 | Zhou | G09G 3/32 |
| 2019/0279565 A1* | 9/2019 | Yang | G09G 3/3266 |

* cited by examiner

*Primary Examiner* — Darlene M Ritchie
(74) *Attorney, Agent, or Firm* — CKC & Partners Co., LLC

(57) ABSTRACT

An alternating self-compensation circuit including a light-emitting device, a first driving circuit, and a second driving circuit is provided. The first driving circuit is configured to function and to drive the light-emitting device during a first time period. The second driving circuit is configured to function and to drive the light-emitting device during a second time period. The first driving circuit and the second driving circuit are electrically and separately connected to one of two ends of the light-emitting device, and the first time period and the second time period are at least partially overlapped in time. The first driving circuit includes a delivery capacitor, a driving transistor, a reset circuit, a compensation circuit, and a data circuit. The second driving circuit also includes a delivery capacitor, a driving transistor, a reset circuit, a compensation circuit, and a data circuit.

32 Claims, 39 Drawing Sheets

ALTERNATING SELF-COMPENSATION CIRCUIT

BACKGROUND

Field of Invention

The present disclosure relates to an alternating self-compensation circuit.

Description of Related Art

The statements in this section merely provide background information related to the present disclosure and do not necessarily constitute prior art.

In recent years, different types of displays such as a thin film transistor liquid crystal display (TFT-LCD) and a thin film transistor organic light-emitting display (TFT-OLED) become more common and available. Some types of novel displays also being actively investigated with research and development resources, such as a mini light-emitting diode (mini-LED) display and a micro light-emitting diode (μ-LED) display. Conventional circuits for driving pixels in these displays encounter a problem on a threshold voltage shift of a driving transistor for driving a light-emitting device in the circuits.

SUMMARY

According to some embodiments of the present disclosure, an alternating self-compensation circuit including a light-emitting device, a first driving circuit, and a second driving circuit is provided. The first driving circuit is configured to drive the light-emitting device during a first time period. The first driving circuit includes a first delivery capacitor, a first driving transistor, a first reset circuit, a first compensation circuit, and a first data circuit. The first delivery capacitor is electrically connected to a low-level voltage. The first driving transistor is configured to drive the light-emitting device according to a first driving voltage. The first driving voltage is received from a first driving voltage line in which a voltage level thereof is higher than that of the low-level voltage. The first reset circuit is electrically connected to the first driving transistor through a first node. The first reset circuit is also electrically connected to the light-emitting diode. The first reset circuit is configured to determine whether to electrically connect the light-emitting device to the first node. The first compensation circuit is electrically connected to the first node and the first delivery capacitor. The first compensation circuit is configured to receive a first reference voltage which is higher than the low-level voltage and to control a gate voltage of the first driving transistor through a second node. The first data circuit is configured to receive a first data voltage, and to determine whether to electrically connect the first data voltage to the first compensation circuit and whether to electrically connect the first data voltage to the first delivery capacitor. The second driving circuit is configured to drive the light-emitting device during a second time period. The second driving circuit includes a second delivery capacitor, a second driving transistor, a second reset circuit, a second compensation circuit, and a second data circuit. The second delivery capacitor is electrically connected to a low-level voltage. The second driving transistor is configured to drive the light-emitting device according to a second driving voltage. The second driving voltage is received from a second driving voltage line in which a voltage level thereof is higher than that of the low-level voltage. The second reset circuit is electrically connected to the second driving transistor through a third node. The second reset circuit is also electrically connected to the light-emitting diode. The second reset circuit is configured to determine whether to electrically connect the light-emitting device to the third node. The second compensation circuit is electrically connected to the fourth node and the second delivery capacitor. The second compensation circuit is configured to receive a second reference voltage which is higher than the low-level voltage and to control a gate voltage of the second driving transistor through a fourth node. The second data circuit is configured to receive a second data voltage, and to determine whether to electrically connect the second data voltage to the second compensation circuit and whether to electrically connect the second data voltage to the second delivery capacitor. The first driving circuit and the second driving circuit are electrically and separately connected to one of two ends of the light-emitting device, and the first time period and the second time period are at least partially overlapped in time.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
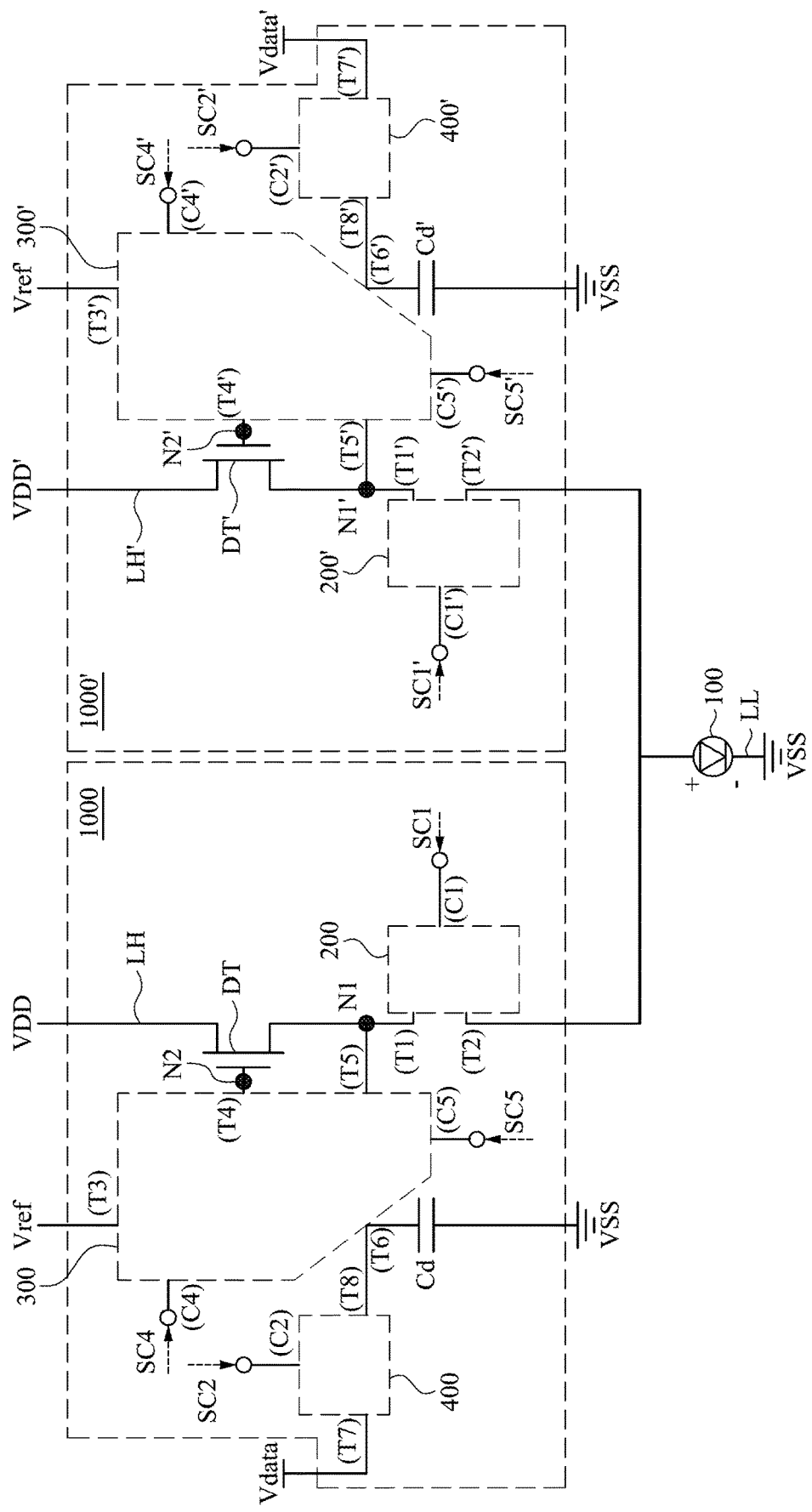
FIG. 1 is a schematic diagram of an alternating self-compensation circuit according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments. Although most of terms described in the following disclosure use singular nouns, said terms may also be plural in accordance with figures or practical applications.

Figure 2:
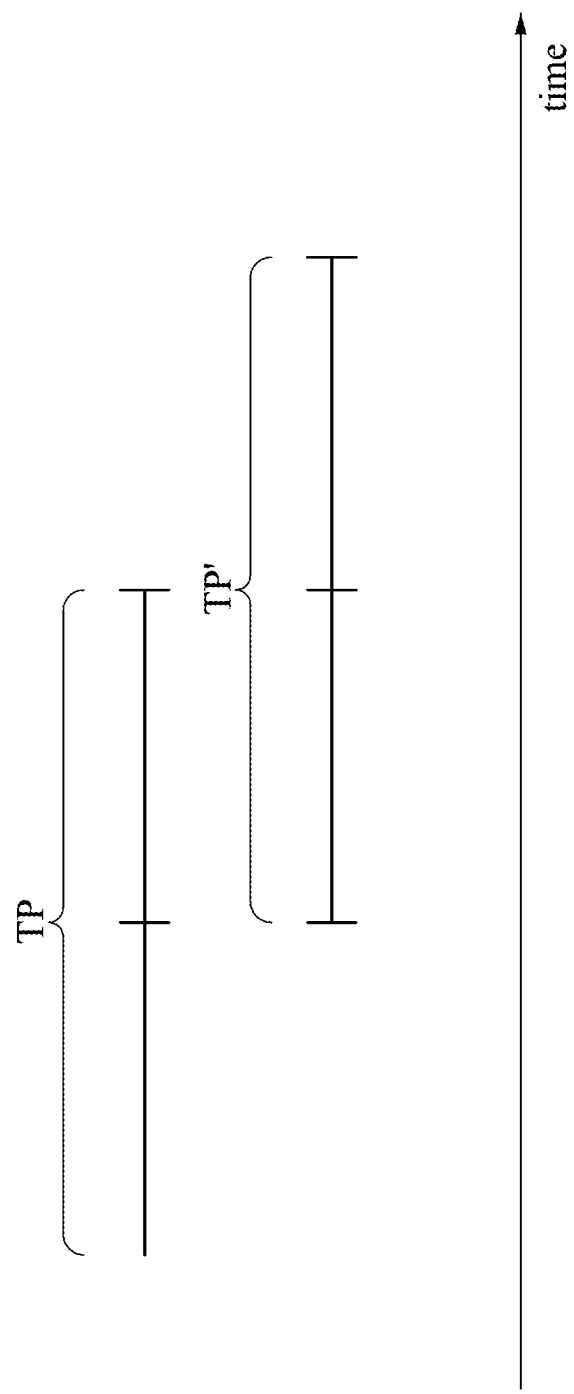
FIG. 2 is a timing diagram of operations in both the first time period and the second time period respectively for the first driving circuit and the second driving circuit according to some embodiments of the present disclosure.

Reference is made to FIGS. 1 and 2. FIG. 1 is a schematic diagram of an alternating self-compensation circuit 1 according to some embodiments of the present disclosure. FIG. 2 is a timing diagram of operations in both the first time period TP and the second time period TP' respectively for the first driving circuit 1000 and the second driving circuit 1000' according to some embodiments of the present disclosure. In some embodiments, the alternating self-compensation circuit 1 includes a light-emitting device 100, a first driving circuit 1000, and a second driving circuit 1000'. In some embodiments, the first driving circuit 1000 is configured to drive the light-emitting device 100 during a first time period TP, and the second driving circuit 1000' is configured to drive the light-emitting device 100 during a second time period TP'. The first driving circuit 1000 and the second driving circuit 1000' are electrically and separately connected to one of two ends of the light-emitting device 100, as clearly shown in FIG. 1. In some embodiments, the first time period (TP) and the second time period (TP') are at least partially overlapped in time. In general, the first driving circuit 1000 and the second driving circuit 1000' alternately provide currents to drive the light-emitting device 100. While the light-emitting device 100 is driven by one of the first driving circuit 1000 and the second driving circuit 1000' (e.g., the first driving circuit 1000), the other of the first driving circuit 1000 and the second driving circuit 1000' (e.g., the second driving circuit 1000') does not provide a current to light up the light-emitting device 100. When the light-emitting device 100 is lighted up by the first driving circuit 1000, the second driving circuit 1000' can perform some additional functions which cannot be done during a time segment when the light-emitting device 100 is lighted up by the second driving circuit 1000'. Said additional functions include, such as a self-compensation function and/or a recovery function for a threshold voltage shift of at least one electronic component within the second driving circuit 1000', but should not be limited thereto. Specific implementations of the above operations and functions will be described in details in the following embodiments and figures of the present disclosure.

The focus is now on the first driving circuit 1000. In some embodiments, the first driving circuit 1000 includes a first delivery capacitor Cd, a first driving transistor DT, a first reset circuit 200, a first compensation circuit 300, and a first data circuit 400. The first delivery capacitor Cd is electrically connected to a low-level voltage VSS. The first driving transistor DT is configured to drive the light-emitting device 100 according to a first driving voltage VDD. The first driving voltage VDD is received by a first driving voltage line LH and is electrically connected to the first driving transistor DT. A voltage level of the first driving voltage VDD is higher than a voltage level of the low-level voltage VSS. The low-level voltage VSS can be a ground level voltage, but should not be limited thereto. The first driving voltage VDD can be provided by a power source circuit and will not be described herein in detail. The first reset circuit 200 is electrically connected to the first driving transistor DT through a first node N1. The first reset circuit 200 is also electrically connected to the light-emitting device 100. The first reset circuit 200 is configured to determine whether to allow a current to flow from the first node N1 to the low-level voltage VSS through the light-emitting device 100. In some embodiments as shown in FIG. 1, the first reset circuit 200 is configured to determine whether to electrically connect the light-emitting device 100 to the first node N1. The first compensation circuit 300 is electrically connected to the first node N1 and the first delivery capacitor Cd. The first compensation circuit 300 is configured to receive a first reference voltage Vref and to control a gate voltage of the first driving transistor DT through a second node N2. A voltage level of the first reference voltage Vref is higher than the voltage level of the low-level voltage VSS. In some embodiments, the first reference voltage Vref and the first driving voltage VDD can have the same voltage level (e.g., the first driving voltage VDD is also applied to the first compensation circuit 300). The first data circuit 400 is configured to receive a first data voltage Vdata and to determine whether to electrically connect the first data voltage Vdata to the first compensation circuit 300 and whether to electrically connect the first data voltage Vdata to the first delivery capacitor Cd.

The "electrically connected" as interpreted in figures of the present disclosure can be "direct connected", but should not be limited thereto. Some minor electronic components (e.g., resistors) which do not affect operations and result as disclosed in the embodiments of the present disclosure can be present between two electrically connected components, and can be incorporated into the meaning of the "electrically connected" in the scope of the present disclosure.

In some embodiments, the first reset circuit 200 includes two terminals T1 and T2 and a control terminal C1, but should not be limited thereto. In some embodiments, the first compensation circuit 300 includes four terminals T3, T4, T5, and T6 and two control terminals C4 and C5, but should not be limited thereto. In some embodiments, the first data circuit 400 includes two terminals T7 and T8 and a control terminal C2, but should not be limited thereto.

Reference is made to the first reset circuit 200 as shown in FIG. 1. The terminal T1 is electrically connected to a source terminal of the first driving transistor DT through a first node N1. The terminal T2 is electrically connected to the low-level voltage VSS via the light-emitting device 100. The first reset circuit 200 is electrically connected to the light-emitting device 100 in series between the first driving transistor DT and a low-level voltage line LL. The determination of whether to electrically connect the first node N1 to the light-emitting device 100 is in accordance with a scan signal SC1 received by the control terminal C1. When the light-emitting device 100 and the first driving transistor DT are electrically connected, they are electrically connected through the first reset circuit 200.

Reference is made to the first compensation circuit 300 as shown in FIG. 1. The terminal T3 is configured to receive the first reference voltage Vref. The terminal T4 is electrically connected to the first driving transistor DT and is used to control a gate voltage of the first driving transistor DT. The terminal T5 is electrically connected to the first reset circuit 200 through the first node N1. The terminal T6 is electrically connected to one end of the first delivery capacitor Cd different from another end of the first delivery capacitor Cd which is electrically connected to the low-level voltage VSS. The first compensation circuit 300 is configured to determine whether to receive the first reference voltage Vref in accordance with a scan signal SC4 received by the control terminal C4. The first compensation circuit 300 is configured to determine whether to electrically connect the first data circuit 400 and the first delivery capacitor Cd to the first node N1 in accordance with a scan signal SC5 received by the control terminal C5.

Reference is made to the first data circuit 400 as shown in FIG. 1. The terminal T8 is electrically connected (e.g., directly connected, but should not be limited thereto) to the terminal T6 of the first compensation circuit 300. The determination of whether to electrically connect the first data voltage Vdata to the first compensation circuit 300 and whether to electrically connect the first data voltage Vdata to the first delivery capacitor Cd is in accordance with a scan signal SC2 received by the control terminal C2.

Reference is made to FIG. 1 and FIGS. 3A to 3E. FIGS. 3A to 3E are timing diagrams of operations in the first time period TP for the first driving circuit 1000 according to some embodiments of the present disclosure. The first driving circuit 1000 is operated in the first time period TP which includes a first pre-emission time segment PETS and a first emission time segment ES. The first pre-emission time segment PETS does not overlap with the first emission time segment ES. In some embodiments, the first pre-emission time segment PETS includes a combination of a blank segment BS, a reset segment RS, a compensation segment CS, and a data input segment DIS (as referred to FIG. 3A). In some embodiments, the first pre-emission time segment PETS includes a combination of the reset segment RS, the compensation segment CS, and the data input segment DIS. In some embodiments, the first pre-emission time segment PETS includes a combination of a recovery segment RCS, the reset segment RS, the compensation segment CS, and a data input segment DIS (as referred to FIGS. 3B and 3C). In some embodiments, the first pre-emission time segment PETS includes a combination of the recovery segment RCS, the blank segment BS, and the data input segment DIS (as referred to FIG. 3D). In some embodiments, the first pre-emission time segment PETS includes a combination of the blank segment BS, the recovery segment RCS, the reset segment RS, the compensation segment CS, and the data input segment DIS. In some embodiments, the first pre-emission time segment PETS includes a combination of the blank segment BS and the data input segment DIS (as referred to FIG. 3E). In some embodiments, the reset segment RS, the compensation segment CS, and the data input segment DIS are operated in sequence. Some of these different ways of operation are shown in FIGS. 3A to 3E as exemplifications.

Figure 3A:
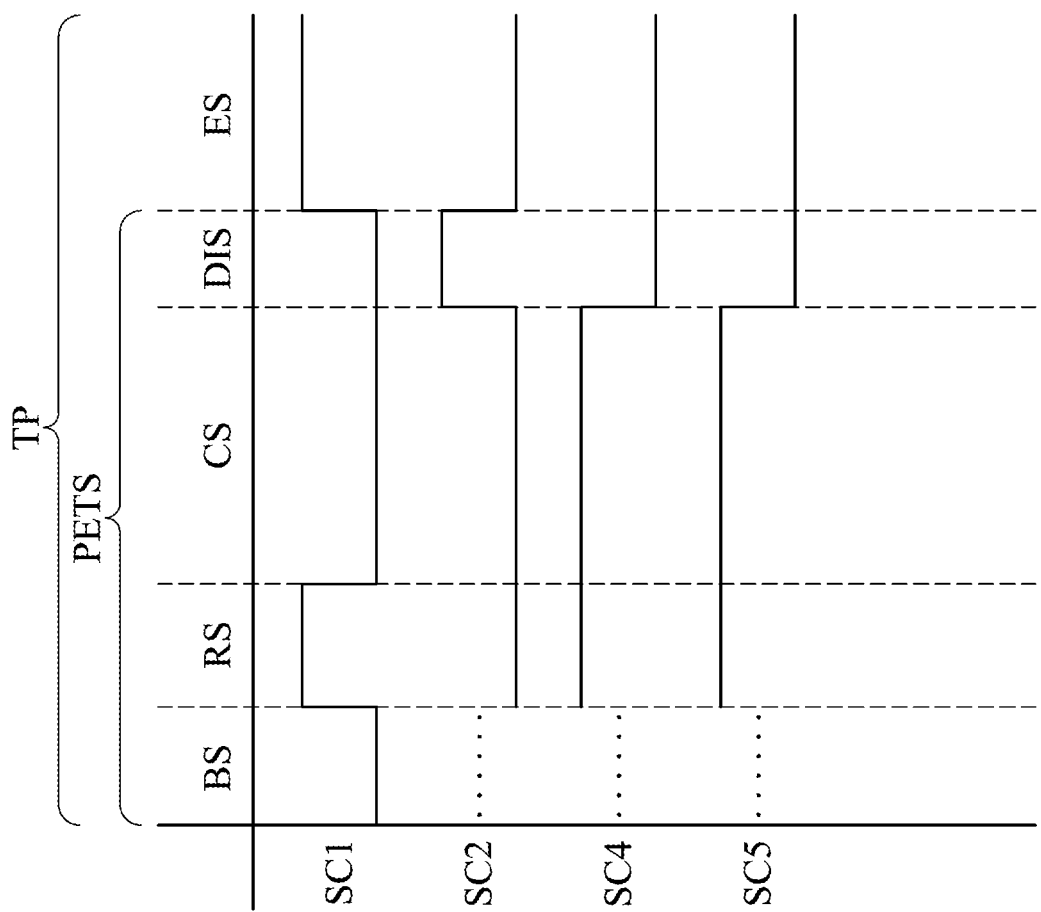
FIG. 3A is a timing diagram of operations in the first time period for the first driving circuit according to some embodiments of the present disclosure.

Reference is made to FIG. 3A, in which the first driving circuit 1000 is operated in the first pre-emission time segment PETS and the emission time segment ES, and the first pre-emission time segment PETS includes the combination of the blank segment BS, the reset segment RS, the compensation segment CS, and the data input segment DIS.

An operation during the reset segment RS is as follows. The first data circuit 400 is disabled and the first reset circuit 200 and the first compensation circuit 300 are enabled, such that the first data voltage Vdata is disallowed to be applied to the first driving transistor DT and a voltage difference between the second node N2 and the first node N1 is greater than a threshold voltage Vth of the first driving transistor DT. Specifically, the scan signal SC4 is applied to the control terminal C4 of the first compensation circuit 300 to enable a control of the gate voltage of the first driving transistor DT by the first reference voltage Vref. More precisely, the first reference voltage Vref is applied to the first driving transistor DT via the terminals T3 and T4 of the first compensation circuit 300. A voltage level of the first reference voltage Vref is higher than a sum of voltage levels of a threshold voltage Vth of the driving transistor DT, the low-level voltage VSS, and a voltage difference between two ends of the light-emitting device 100, so as to enable the first driving transistor DT. Therefore, the first driving voltage VDD is applied to drive a current to flow from the first driving voltage line LH to a first low-level voltage line LL via the first node N1. As a result, a voltage difference between the second node N2 and the first node N1 is increased and a voltage difference between the first node N1 and the low-level voltage VSS becomes a voltage difference between two ends of the light-emitting device 100. The dotted points present in some of the segments as illustrated in all of the timing diagrams means that a state of "enable" or "disable" is irrelevant during the segment under consideration. For example, the state of the scan signals SC2, SC4, and SC5 are irrelevant during the blank segment BS, and only the scan signal SC1 is applied to disable the first reset circuit 200 during the blank segment BS in the embodiments as illustrated by FIG. 3A.

The "enabled" and "disabled" described for the first driving circuit 1000 are explained as follows. The first reset circuit 200 is enabled (disabled) when a current is allowed (disallowed) to flow through the first reset circuit 200. The first compensation circuit 300 is enabled when currents are allowed to flow through the terminals T3, T4, T5, and T6. The first compensation circuit 300 is disabled when a current is disallowed to flow through the terminal T3 and a current is disallowed to flow through the terminal T5. In the reset segment RS, the terminal T5 of the first compensation circuit 300 can be optionally chosen to disallow a current to flow through thereof. A current is allowed to flow through the terminal T6 when the first compensation circuit 300 is disabled, and a current is allowed to flow through the terminal T4 when the first compensation circuit 300 is disabled. The first data circuit 400 is enabled (disabled) when a current is allowed (disallowed) to flow through the terminal T7 to the terminal T8.

After the reset segment RS, the operation continues to the compensation segment CS. The operation during the compensation segment CS is as follows. The first data circuit 400 and the first reset circuit 200 are disabled and the first compensation circuit 300 is enabled, such that a voltage level of the first node N1 is gradually increased until a voltage difference between the second node N2 and the first node (N1) approaches the threshold voltage Vth of the first driving transistor DT. That is, a gate-to-source voltage Vgs is substantially equal to the threshold voltage Vth of the first driving transistor DT. Specifically, the voltage level of the first node N1 is increased since a current flowing from the first driving voltage line LH is disallowed to flow to the first low-level voltage line LL, and the first node N1 is substantially floated and electrically isolated from the low-level voltage VSS. Instead, the current flows to the terminal T5 of the first compensation circuit 300 via the first node N1, such that the floated first node N1 is gradually charged to increase the voltage level of the first node N1 until there is not enough electrical potential to drive said current, which is a moment when the gate-to-source voltage Vgs is substantially equal to the threshold voltage Vth of the first driving transistor DT. A voltage difference substantially (acceptably) equal to the threshold voltage Vth of the first driving transistor DT is thus stored in an electronic component (e.g., a capacitor, or the like) of the first compensation circuit 300. The term "substantially equal to" or "acceptably equal to" means close to a designated value (e.g., close to the threshold voltage) such that one can regard it as the designated value.

After the compensation segment CS, the operation continues to the data input segment DIS. The operation during the data input segment DIS is as follows. The first reset circuit 200 and the first compensation circuit 300 are disabled and the first data circuit 400 is enabled, such that the data voltage Vdata and the threshold voltage Vth of the first driving transistor DT stored in electronic components (e.g., capacitors, or the like) of the first compensation circuit 300 are combined and applied to the first driving transistor DT through the first delivery capacitor Cd and the compensation circuit 300. Specifically, the first data voltage Vdata is applied to the terminal T6 of the first compensation circuit 300, and the first data voltage Vdata plus the threshold voltage Vth are combined by the first compensation circuit 300 to control the gate voltage of the first driving transistor DT in the next coming emission segment ES. As a result, the threshold voltage Vth of the first driving circuit DT is substantially compensated.

After the data input segment DIS, the operation continues to the emission segment ES. The operation during the emission segment ES is as follows. The first data circuit 400 and the first compensation circuit 300 are disabled and the first reset circuit 200 is enabled, such that the light-emitting device 100 is driven according to the first driving voltage VDD and the gate voltage (which is equal to the data voltage Vdata plus the threshold voltage Vth of the first driving transistor DT stored in electronic components (e.g., capacitors, or the like) of the first compensation circuit 300) applied to the first driving transistor DT via the first compensation circuit 300.

With the first driving circuit 1000 and the operations described above, a threshold voltage shift of the first driving transistor DT can be compensated and will not affect an emission current Id of the light-emitting device 100. Specifically, after the operation of the data input segment DIS, the equation I: Vdata+Vth=Vgs+Von is satisfied, in which Von is a voltage difference between two ends of the light-emitting device 100 when the light-emitting device 100 is turned on with the emission current Id flowing through thereof driven by the first driving transistor DT. A voltage sum of "Vdata+Vth" on the left-hand side of the equation I is measured between the second node N2 and the low-level voltage VSS which is electrically connected to one end of the first delivery capacitor Cd. A voltage sum of "Vgs+Von" on the right-hand side of the equation I is measured between the second node N2 and the low-level voltage VSS which is electrically connected to one end of the light-emitting device 100. Using the equation I, the emission current Id during the emission segment ES can be obtained by an algebra in the equation II: Id=K*(Vgs−Vth)$^2$=K*(Vdata+Vth−Von−Vth)$^2$=K*(Vdata−Von)$^2$, which is independent of Vth, and K is a constant value related to properties of the first driving transistor DT. The equation II is an exemplification under an assumption that the first driving transistor DT is operated in the saturation region. However, the emission current Id and the threshold voltage Vth are also independent from each other when the first driving transistor DT is operated in a linear region.

Another advantage of the first driving circuit 1000 and the operations described above is to enhance a precision of controlling brightness, which is particularly useful in a low grayscale region of the light-emitting device 100. Specifically, the emission current Id of the light-emitting device 100 is proportional to a voltage difference between two ends of the light-emitting device 100 (i.e., Von), and a drain-to-source current of the first driving transistor DT (e.g., the thin film transistor in the present embodiments) is proportional to the gate-to-source voltage Vgs under a configuration of the first driving circuit 1000. As such, there are two voltage parameters: the voltage difference between two ends of the light-emitting device 100 (i.e., Von) and the gate-to-source voltage Vgs of the first driving transistor DT which can be used to control the brightness of the light-emitting device 100, and these two voltage parameters (i.e., Von and Vgs) can be controlled by one voltage parameter Vdata according to the equation I: Vdata+Vth=Vgs+Von, derived above. Therefore, a data voltage difference ΔVdata corresponding to a given emission current difference ΔId in the above embodiments is greater than a gate-to-source voltage difference ΔVgs corresponding to said given emission current difference ΔId in conventional circuits, which substantially increases the precision of said control.

Yet another advantage of the first driving circuit 1000 and the operations described above is that since the first data circuit 400 is only enabled by the scan signal SC2 during the data input segment DIS, the first data voltage Vdata can be used to drive other pixels in other scan lines during the reset segment RS and the compensation segment CS of the pixel under consideration of the present embodiments, which greatly enhances a resolution, so that the first data voltage Vdata is only occupied by one scan line time (i.e. only occupied by the data input segment DIS) and can be used to drive a high resolution display. The operations described above can substantially skip the duration for waiting the compensation segment CS, so as to be more suitable to drive a high resolution display.

Figure 3B:
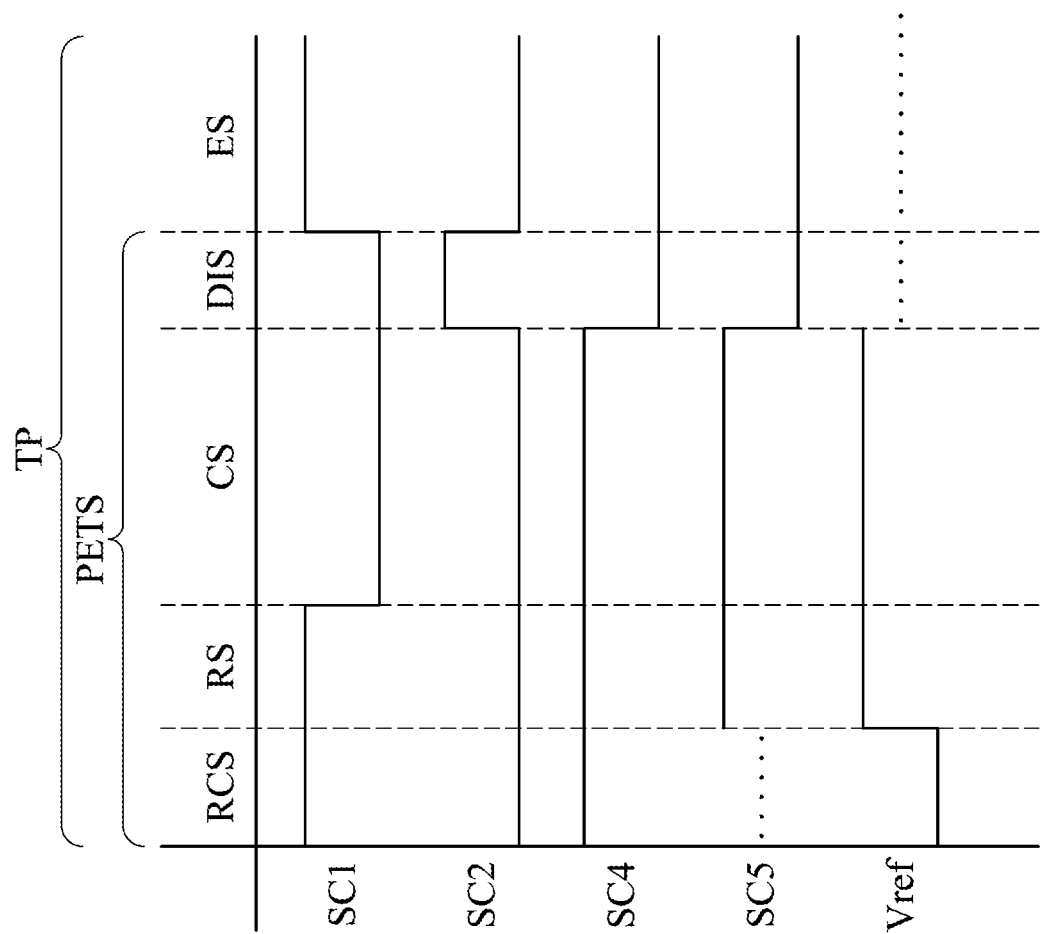
FIG. 3B is a timing diagram of operations in the first time period for the first driving circuit according to some embodiments of the present disclosure.

Reference is made to FIG. 3B. The difference between embodiments as shown in FIG. 3B and the embodiments as shown in FIG. 3A is that the blank segment BS in the embodiments illustrated by FIG. 3A is replaced by the recovery segment RCS in the embodiments illustrated FIG. 3B. In some embodiments, a combination of enablement and disablement of the first reset circuit 200, the first compensation circuit 300, and the first data circuit 400 of the recovery segment RCS can be the same as that during the reset segment RS. The difference between the recovery segment RCS and the reset segment RS is that the voltage level of the first reference voltage Vref applied during the reset segment RS is higher than a sum of the voltage levels of the threshold voltage Vth of the first driving transistor DT, the low-level voltage VSS, and a voltage difference between two ends of the light-emitting device 100, whereas a voltage level of the first reference voltage Vref applied during the recovery segment RCS is lower than the sum of the voltage levels of the threshold voltage Vth of the first driving transistor DT, the low-level voltage VSS, and the voltage difference between two ends of the light-emitting device 100. Therefore, the threshold voltage shift of the first driving transistor DT due to the operation during the emission segment ES may have a certain degree of recovery during the recovery segment RCS.

Figure 3C:
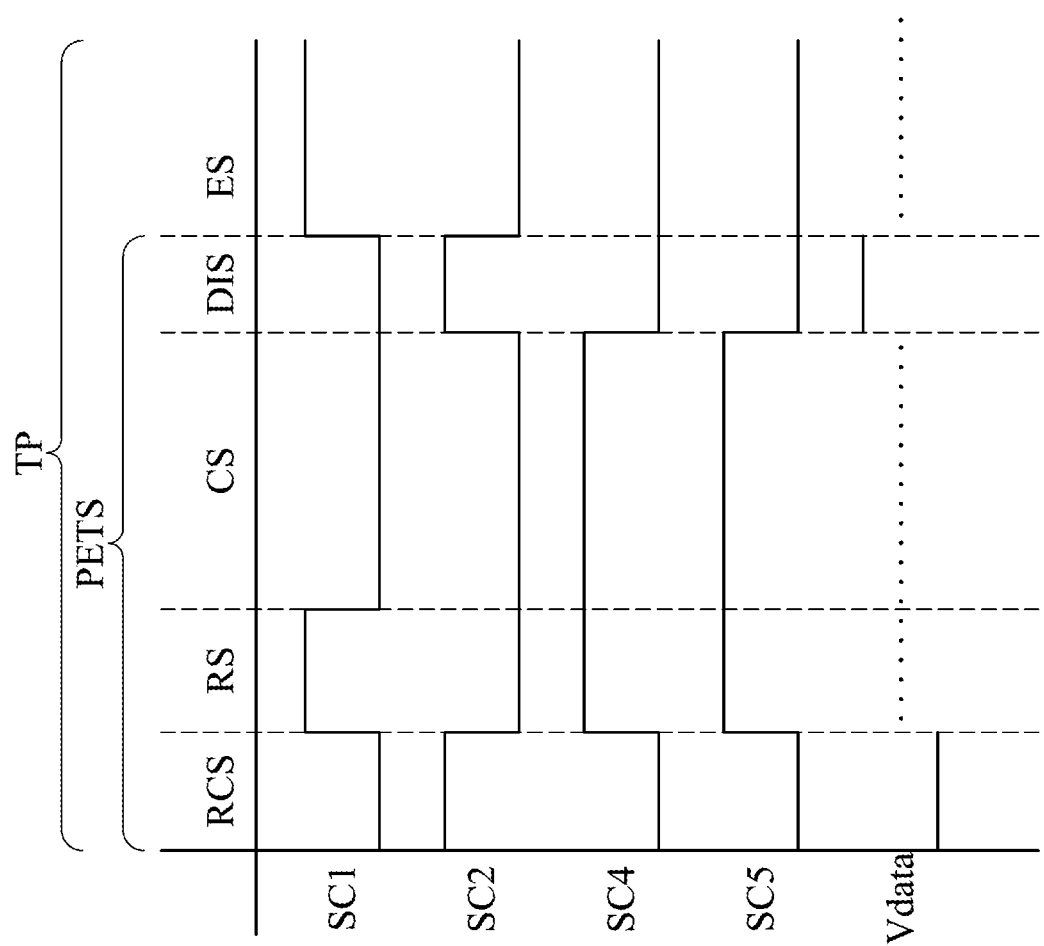
FIG. 3C is a timing diagram of operations in the first time period for the first driving circuit according to some embodiments of the present disclosure.

Reference is made to FIG. 3C. The difference between embodiments as shown in FIG. 3C and the embodiments as shown in FIG. 3B is that the gate voltage of the first driving transistor DT for said recovery is applied by the first data voltage Vdata. A combination of enablement and disablement of the first reset circuit 200, the first compensation circuit 300, and first the data circuit 400 during the recovery segment RCS in the embodiments illustrated by FIG. 3C can be the same as that during the data input segment DIS, except that a voltage level of the first data voltage Vdata during the recovery segment RCS is lower than the sum of the voltage levels of the threshold voltage Vth of the first driving transistor DT, the low-level voltage VSS, and the voltage difference between two ends of the light-emitting device 100.

Figure 3D:
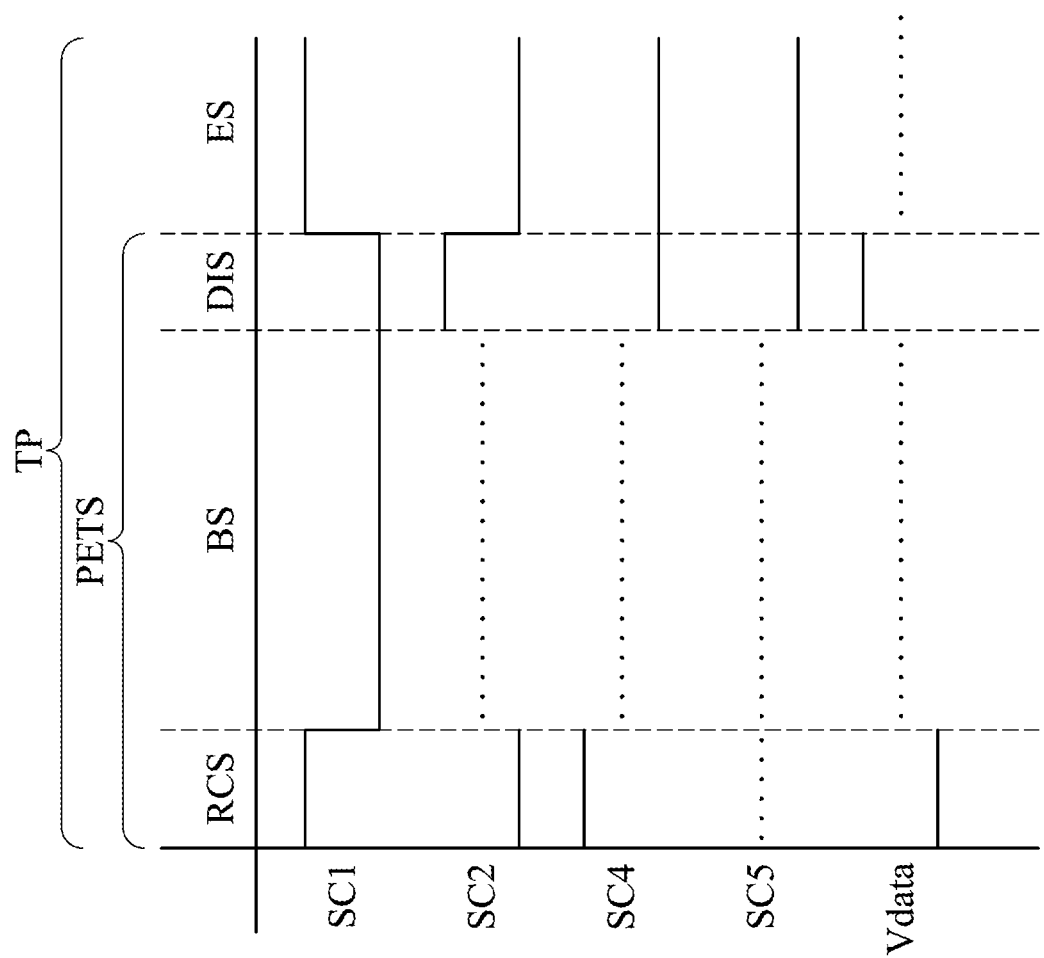
FIG. 3D is a timing diagram of operations in the first time period for the first driving circuit according to some embodiments of the present disclosure.

Reference is made to FIG. 3D. The difference between embodiments as shown in FIG. 3D and the embodiments as shown in FIG. 3C is that the first pre-emission time segment PETS in FIG. 3D includes only the recovery segment RCS, the blank segment BS, and the data input segment DIS. The reset segment RS and the compensation segment CS are not included in the first pre-emission time segment PETS. It can be understood that not every frame needs compensation within one pixel.

Figure 3E:
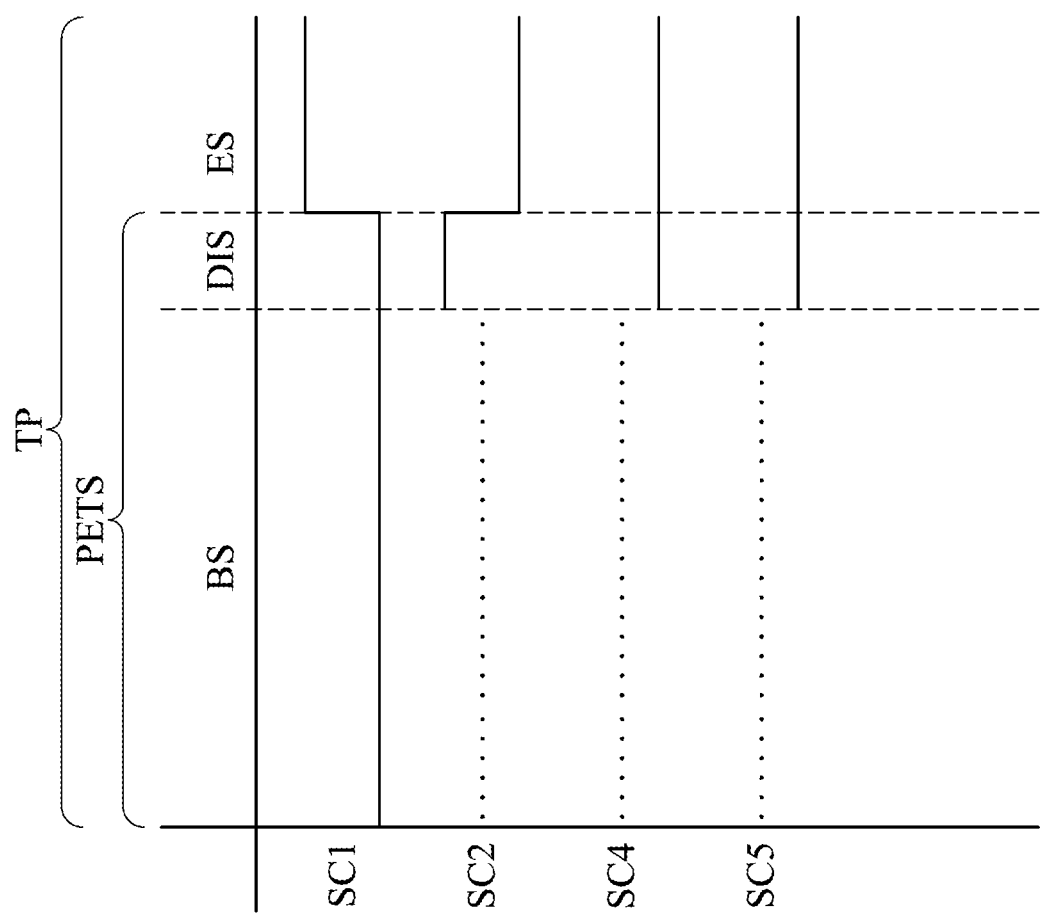
FIG. 3E is a timing diagram of operations in the first time period for the first driving circuit according to some embodiments of the present disclosure.

Reference is made to FIG. 3E. In some embodiments, the first pre-emission time segment PETS only includes the blank segment BS and the data input segment DIS, which means the first compensation circuit 300 and the first data circuit 400 can be kept in states the same as those at the end of the previous operation during the blank segment BS, no matter they are enabled or disabled, while the first reset circuit 200 is disabled during the blank segment BS.

Figure 3F:
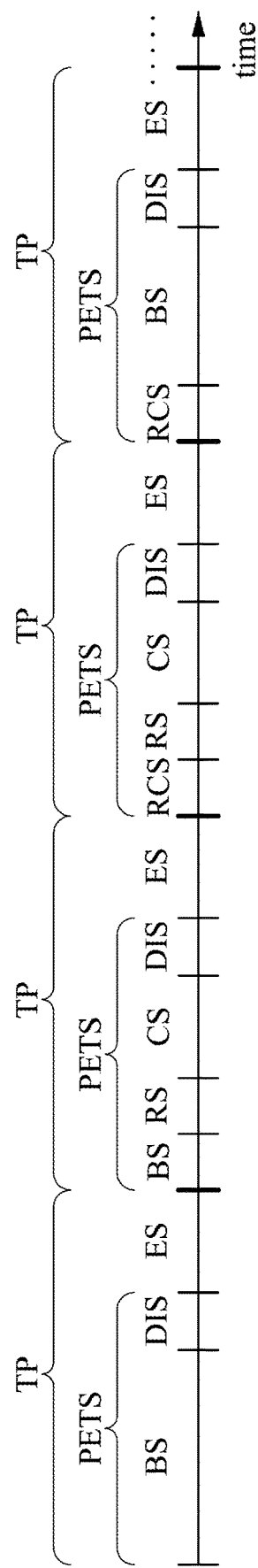
FIG. 3F is a timing diagram of a combination of operations in the first time period for the first driving circuit according to some embodiments of the present disclosure.

Reference is made to FIG. 3F. FIG. 3F is a timing diagram of a combination of operations in the first time period TP for the first driving circuit 1000 according to some embodiments of the present disclosure. Embodiments illustrated by FIG. 3F exemplifies a combination of four of different first pre-emission time segments PETS and four of different first emission time segments ES operated in sequence. First of the first pre-emission time segments PETS includes the blank segment BS and the data input segment DIS. Second of the first pre-emission time segments PETS from the left includes the blank segment BS, the reset segment RS, the compensation segment CS, and the data input segment DIS. Third of the first pre-emission time segments PETS includes the recovery segment RCS, the reset segment RS, the compensation segment CS, and the data input segment DIS. Fourth of the first pre-emission time segments PETS includes the recovery segment RCS, the blank segment BS, and the data input segment DIS. Although the embodiments illustrated by FIG. 3F only shows one example of the combination, it should not be limited thereto. Other embodiments with different types of combinations using the blank segment BS, the recovery segment RCS, the reset segment RS, the compensation segment CS, and the data input segment DIS are also within the scope of the present disclosure.

Reference is made back to FIG. 1 and also made to FIGS. 4A to 4F. Now the focus is turned to the second driving circuit 1000'. In some embodiments, the second driving circuit 1000' includes a second delivery capacitor Cd', a second driving transistor DT', a second reset circuit 200', a second compensation circuit 300', and a second data circuit 400'. The second delivery capacitor Cd' is electrically connected to a low-level voltage VSS. The second driving transistor DT' is configured to drive the light-emitting device 100 according to a second driving voltage VDD'. The second driving voltage VDD' is received by a second driving voltage line LH' and is electrically connected to the second driving transistor DT'. A voltage level of the second driving voltage VDD' is higher than a voltage level of the low-level voltage VSS. The low-level voltage VSS can be a ground level voltage, but should not be limited thereto. The second driving voltage VDD' can be provided by a power source circuit and will not be described herein in detail. The second reset circuit 200' is electrically connected to the second driving transistor DT' through a third node N1'. The second reset circuit 200' is also electrically connected to the light-emitting device 100. The second reset circuit 200' is configured to determine whether to allow a current to flow from the third node N1' to the low-level voltage VSS through the light-emitting device 100. In some embodiments as shown in FIG. 1, the second reset circuit 200' is configured to determine whether to electrically connect the light-emitting device 100 to the third node N1'. The second compensation circuit 300' is electrically connected to the third node N1' and the second delivery capacitor Cd'. The second compensation circuit 300' is configured to receive a second reference voltage Vref' and to control a gate voltage of the second driving transistor DT' through a fourth node N2'. A voltage level of the second reference voltage Vref' is higher than the voltage level of the low-level voltage VSS. In some embodiments, the second reference voltage Vref' and the second driving voltage VDD' can have the same voltage level (e.g., the second driving voltage VDD' is applied to the second compensation circuit 300'). The second data circuit 400' is configured to receive a second data voltage Vdata' and to determine whether to electrically connect the second data voltage Vdata' to the second compensation circuit 300' and whether to electrically connect the second data voltage Vdata' to the second delivery capacitor Cd'.

In some embodiments, the second reset circuit 200' includes two terminals T1' and T2' and a control terminal C1', but should not be limited thereto. In some embodiments, the second compensation circuit 300' includes four terminals T3', T4', T5', and T6' and two control terminals C4' and C5', but should not be limited thereto. In some embodiments, the second data circuit 400' includes two terminals T7' and T8' and a control terminal C2', but should not be limited thereto.

Reference is made to the second reset circuit 200' as shown in FIG. 1. The terminal T1' is electrically connected to a source terminal of the second driving transistor DT' through a third node N1'. The terminal T2' is electrically connected to the low-level voltage VSS via the light-emitting device 100. The second reset circuit 200' is electrically connected to the light-emitting device 100 in series between the second driving transistor DT' and the low-level voltage line LL. The determination of whether to electrically connect the third node N1' to the light-emitting device 100 is in accordance with a scan signal SC1' received by the control terminal C1'. When the light-emitting device 100 and the second driving transistor DT' are electrically connected, they are electrically connected through the second reset circuit 200'.

Reference is made to the second compensation circuit 300' as shown in FIG. 1. The terminal T3' is configured to receive the second reference voltage Vref'. The terminal T4' is electrically connected to the second driving transistor DT' and is used to control a gate voltage of the second driving transistor DT'. The terminal T5' is electrically connected to the second reset circuit 200' through the third node N1'. The terminal T6' is electrically connected to one end of the second delivery capacitor Cd' different from another end of the second delivery capacitor Cd' which is electrically connected to the low-level voltage VSS. The second compensation circuit 300' is configured to determine whether to receive the second reference voltage Vref' in accordance with a scan signal SC4' received by the control terminal C4'. The second compensation circuit 300' is configured to determine whether to electrically connect the second data circuit 400' and the second delivery capacitor Cd' to the third node N1' in accordance with a scan signal SC5' received by the control terminal C5'.

Reference is made to the second data circuit 400' as shown in FIG. 1. The terminal T8' is electrically connected (e.g., directly connected, but should not be limited thereto) to the terminal T6' of the second compensation circuit 300'. The determination of whether to electrically connect the second data voltage Vdata' to the second compensation circuit 300' and whether to electrically connect the second data voltage Vdata' to the second delivery capacitor Cd' is in accordance with a scan signal SC2' received by the control terminal C2'.

Reference is made to FIG. 1 and FIGS. 4A to 4E. FIGS. 4A to 4E are timing diagrams of operations in the second time period TP' for the second driving circuit 1000' according to some embodiments of the present disclosure. The second driving circuit 1000' is operated in the second time period TP' which includes a second pre-emission time segment PETS' and a second emission time segment ES'. The second pre-emission time segment PETS' does not overlap with the second emission time segment ES'. In some embodiments, the second pre-emission time segment PETS' includes a combination of a blank segment BS', a reset segment RS', a compensation segment CS', and a data input segment DIS' (as referred to FIG. 4A). In some embodiments, the second pre-emission time segment PETS' includes a combination of the reset segment RS', the compensation segment CS', and the data input segment DIS'. In some embodiments, the second pre-emission time segment PETS' includes a combination of a recovery segment RCS', the reset segment RS', the compensation segment CS', and a data input segment DIS' (as referred to FIGS. 4B and 4C). In some embodiments, the second pre-emission time segment PETS' includes a combination of the recovery segment RCS', the blank segment BS', and the data input segment DIS' (as referred to FIG. 4D). In some embodiments, the second pre-emission time segment PETS' includes a combination of the blank segment BS', the recovery segment RCS', the reset segment RS', the compensation segment CS', and the data input segment DIS'. In some embodiments, the second pre-emission time segment PETS' includes a combination of the blank segment BS' and the data input segment DIS' (as referred to FIG. 4E). In some embodiments, the reset segment RS', the compensation segment CS', and the data input segment DIS' are operated in sequence. Some of these different ways of operation are shown in FIGS. 4A to 4E as exemplifications.

Figure 4A:
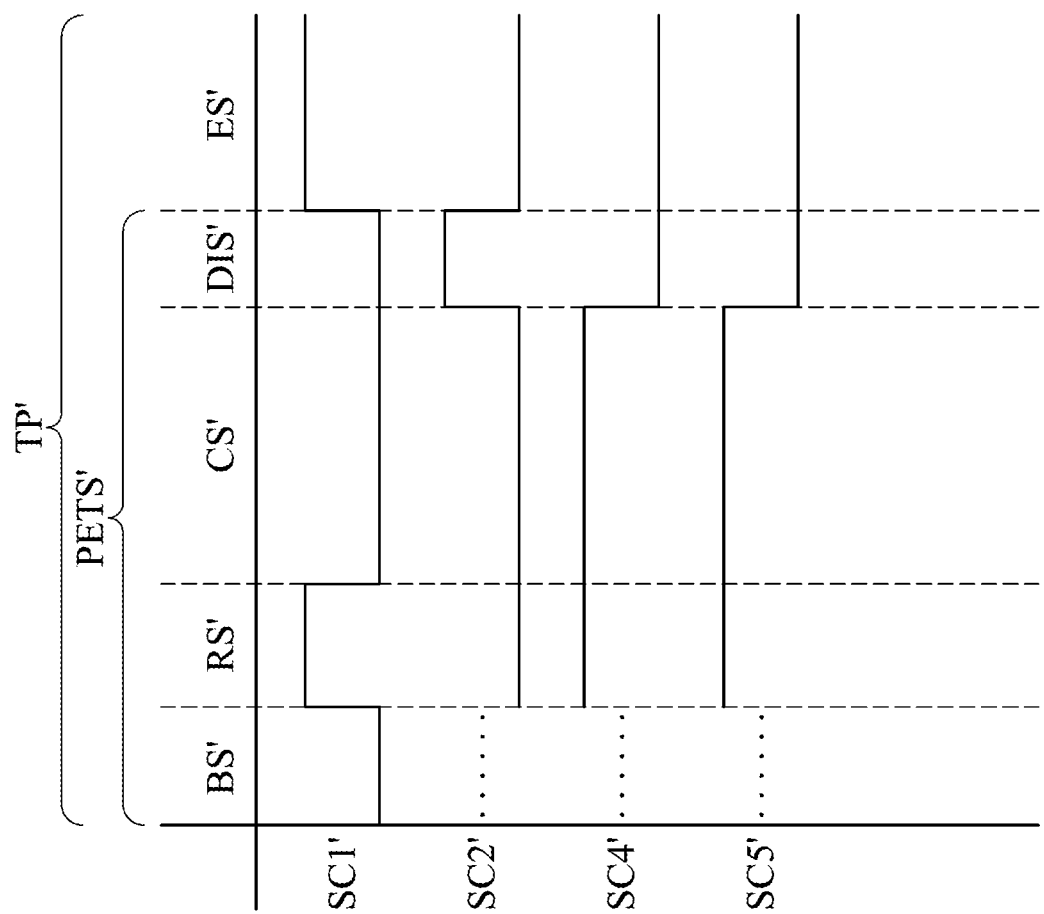
FIG. 4A is a timing diagram of operations in the second time period for the second driving circuit according to some embodiments of the present disclosure.

Reference is made to FIG. 4A, in which the second driving circuit 1000' is operated in the second pre-emission time segment PETS' and the emission time segment ES', and the second pre-emission time segment PETS' includes the combination of the blank segment BS', the reset segment RS', the compensation segment CS', and the data input segment DIS'.

An operation during the reset segment RS' is as follows. The second data circuit 400' is disabled and the second reset circuit 200' and the second compensation circuit 300' are enabled, such that the second data voltage Vdata' is disallowed to be applied to the second driving transistor DT' and a voltage difference between the fourth node N2' and the third node N1' is greater than a threshold voltage Vth' of the second driving transistor DT'. Specifically, the scan signal SC4' is applied to the control terminal C4' of the second compensation circuit 300' to enable a control of the gate voltage of the second driving transistor DT' by the second reference voltage Vref'. More precisely, the second reference voltage Vref' is applied to the second driving transistor DT' via the terminals T3' and T4' of the second compensation circuit 300'. A voltage level of the second reference voltage Vref' is higher than a sum of voltage levels of a threshold voltage Vth' of the second driving transistor DT', the low-level voltage VSS, and a voltage difference between two ends of the light-emitting device 100, so as to enable the second driving transistor DT'. Therefore, the second driving voltage VDD' is applied to drive a current to flow from the second driving voltage line LH' to a second low-level voltage line LL via the third node N1'. As a result, a voltage difference between the fourth node N2' and the third node N1' is increased and a voltage difference between the third node N1' and the low-level voltage VSS becomes a voltage difference between two ends of the light-emitting device 100.

The "enabled" and "disabled" described for the second driving circuit 1000' are explained as follows. The second reset circuit 200' is enabled (disabled) when a current is allowed (disallowed) to flow through the second reset circuit 200'. The second compensation circuit 300' is enabled when currents are allowed to flow through the terminals T3', T4', T5', and T6'. The second compensation circuit 300' is disabled when a current is disallowed to flow through the terminal T3' and a current is disallowed to flow through the terminal T5'. In the reset segment RS', the terminal T5' of the second compensation circuit 300' can be optionally chosen to disallow a current to flow through thereof. A current is allowed to flow through the terminal T6' when the second compensation circuit 300' is disabled, and a current is allowed to flow through the terminal T4' when the second compensation circuit 300' is disabled. The second data circuit 400' is enabled (disabled) when a current is allowed (disallowed) to flow through the terminal T7' to the terminal T8'.

After the reset segment RS', the operation continues to the compensation segment CS'. The operation during the compensation segment CS' is as follows. The second data circuit 400' and the second reset circuit 200' are disabled and the second compensation circuit 300' is enabled, such that a voltage level of the third node N1' is gradually increased until a voltage difference between the fourth node N2' and the third node N1' approaches the threshold voltage Vth' of the second driving transistor DT'. That is, a gate-to-source voltage Vgs' is substantially equal to the threshold voltage Vth' of the second driving transistor DT'. Specifically, the voltage level of the third node N1' is increased since a current flowing from the second driving voltage line LH' is disallowed to flow to the low-level voltage line LL, and the third node N1' is substantially floated and electrically isolated from the low-level voltage VSS. Instead, the current flows to the terminal T5' of the second compensation circuit 300' via the third node N1', such that the floated third node N1' is gradually charged to increase the voltage level of the third node N1' until there is not enough electrical potential to drive said current, which is a moment when the gate-to-source voltage Vgs' is substantially equal to the threshold voltage Vth' of the second driving transistor DT'. A voltage difference substantially (acceptably) equal to the threshold voltage Vth' of the second driving transistor DT' is thus stored in an electronic component (e.g., a capacitor, or the like) of the second compensation circuit 300'. The term "substantially equal to" or "acceptably equal to" means close to a designated value (e.g., close to the threshold voltage) such that one can regard it as the designated value.

After the compensation segment CS', the operation continues to the data input segment DIS'. The operation during the data input segment DIS' is as follows. The second reset circuit 200' and the second compensation circuit 300' are disabled and the second data circuit 400' is enabled, such that the second data voltage Vdata' and the threshold voltage Vth' of the second driving transistor DT' stored in electronic components (e.g., capacitors, or the like) of the second compensation circuit 300' are combined and applied to the second driving transistor DT' through the second delivery capacitor Cd' and the compensation circuit 300'. Specifically, the second data voltage Vdata' is applied to the terminal T6' of the second compensation circuit 300', and the second data voltage Vdata' plus the threshold voltage Vth' are combined by the second compensation circuit (300') to control the gate voltage of the second driving transistor DT' in the next coming emission segment ES'. As a result, the threshold voltage Vth' of the second driving circuit DT' is substantially compensated.

After the data input segment DIS', the operation continues to the emission segment ES'. The operation during the emission segment ES' is as follows. The second data circuit 400' and the second compensation circuit 300' are disabled and the second reset circuit 200' is enabled, such that the light-emitting device 100 is driven according to the second driving voltage VDD' and the gate voltage (which is equal to the second data voltage Vdata' plus the threshold voltage Vth' of the second driving transistor DT' stored in electronic components (e.g., capacitors, or the like) of the second compensation circuit 300') applied to the second driving transistor DT' via the second compensation circuit 300'.

With the second driving circuit 1000' and the operations described above, a threshold voltage shift of the second driving transistor DT' can be compensated and will not affect an emission current Id of the light-emitting device 100. Specifically, after the operation of the data input segment DIS', the equation III: Vdata'+Vth'=Vgs'+Von is satisfied, in which Von is a voltage difference between two ends of the light-emitting device 100 when the light-emitting device 100 is turned on with the emission current Id flowing through thereof driven by the second driving transistor DT'. A voltage sum of "Vdata'+Vth'" on the left-hand side of the equation III is measured between the fourth node N2' and the low-level voltage VSS which is electrically connected to one end of the second delivery capacitor Cd'. A voltage sum of "Vgs'+Von" on the right-hand side of the equation III is measured between the fourth node N2' and the low-level voltage VSS which is electrically connected to one end of the light-emitting device 100. Using the equation II, the emission current Id during the emission segment ES' can be obtained by an algebra in the equation IV: $Id=K'*(Vgs'-Vth')^2=K'*(Vdata'+Vth'-Von-Vth')^2=K'*(Vdata'-Von)^2$, which is independent of Vth', and K' is a constant value related to properties of the second driving transistor DT'. The equation IV is an exemplification under an assumption that the second driving transistor DT' is operated in the saturation region. However, the emission current Id and the threshold voltage Vth' are also independent from each other when the second driving transistor DT' is operated in a linear region.

Another advantage of the second driving circuit 1000' and the operations described above is to enhance a precision of controlling brightness, which is particularly useful in a low grayscale region of the light-emitting device 100. Specifically, the emission current Id of the light-emitting device 100 is proportional to a voltage difference between two ends of the light-emitting device 100 (i.e., Von), and a drain-to-source current of the second driving transistor DT' (e.g., the thin film transistor in the present embodiments) is proportional to the gate-to-source voltage Vgs' under a configuration of the second driving circuit 1000'. As such, there are two voltage parameters: the voltage difference between two ends of the light-emitting device 100 (i.e., Von) and the gate-to-source voltage Vgs' of the second driving transistor DT') which can be used to control the brightness of the light-emitting device 100, and these two voltage parameters (i.e., Von and Vgs') can be controlled by one voltage parameter Vdata' according to the equation III: Vdata'+Vth'=Vgs'+Von, derived above. Therefore, a data voltage difference ΔVdata' corresponding to a given emission current difference ΔId in the above embodiments is greater than a gate-to-source voltage difference ΔVgs' corresponding to said given emission current difference ΔId in conventional circuits, which substantially increases the precision of said control.

Yet another advantage of the second driving circuit 1000' and the operations described above is that since the second data circuit 400' is only enabled by the scan signal SC2' during the data input segment DIS', the second data voltage Vdata' can be used to drive other pixels in other scan lines during the reset segment RS' and the compensation segment CS' of the pixel under consideration of the present embodiments, which greatly enhances a resolution, so that the second data voltage Vdata' is only occupied by one scan line time (i.e. only occupied by the data input segment DIS') and can be used to drive a high resolution display. The operations described above can substantially skip the duration for waiting the compensation segment CS', so as to be more suitable to drive a high resolution display.

Figure 4B:
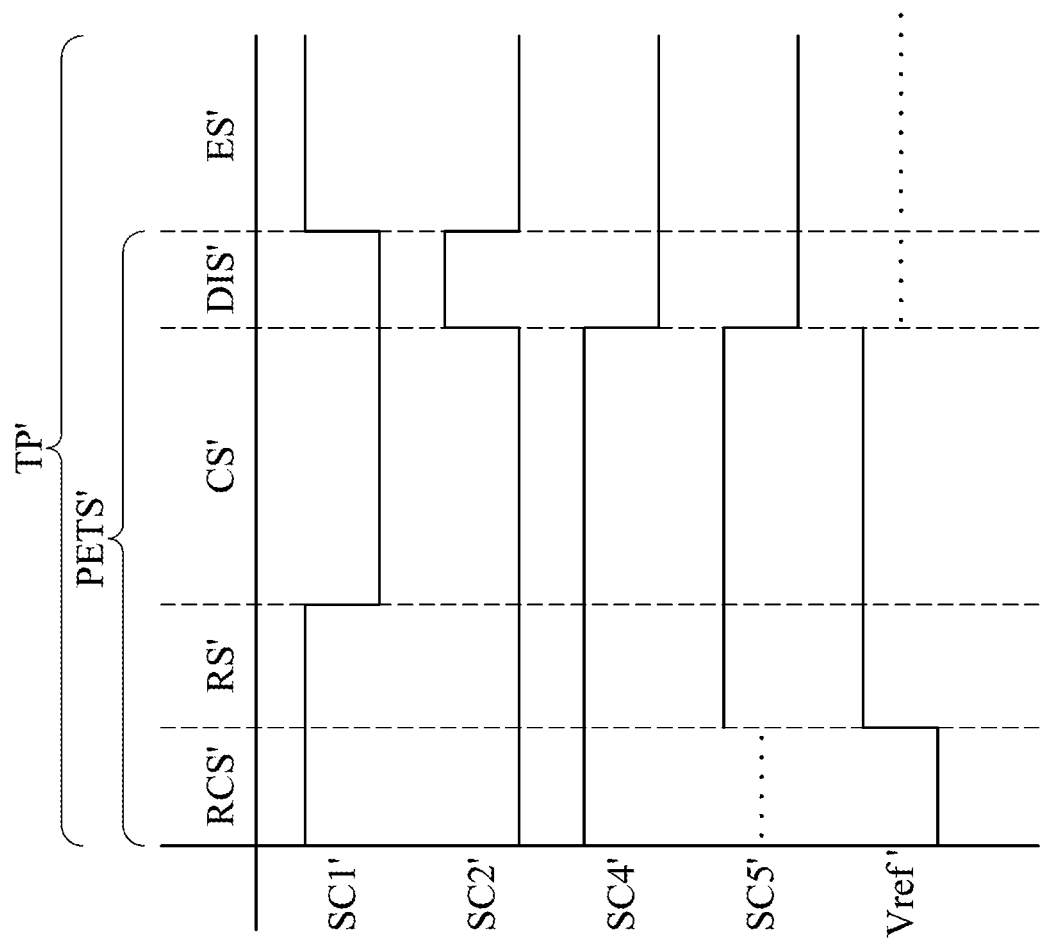
FIG. 4B is a timing diagram of operations in the second time period for the second driving circuit according to some embodiments of the present disclosure.

Reference is made to FIG. 4B. The difference between embodiments as shown in FIG. 4B and the embodiments as shown in FIG. 4A is that the blank segment BS' in the embodiments illustrated by FIG. 4A is replaced by the recovery segment RCS' in the embodiments illustrated FIG. 4B. In some embodiments, a combination of enablement and disablement of the second reset circuit 200', the second compensation circuit 300', and the second data circuit 400' of the recovery segment RCS' can be the same as that during the reset segment RS'. The difference between the recovery segment RCS' and the reset segment RS' is that the voltage level of the second reference voltage Vref' applied during the reset segment RS' is higher than a sum of the voltage levels of the threshold voltage Vth' of the second driving transistor DT', the low-level voltage VSS, and a voltage difference between two ends of the light-emitting device 100, whereas a voltage level of the second reference voltage Vref' applied during the recovery segment RCS' is lower than the sum of the voltage levels of the threshold voltage Vth' of the second driving transistor DT', the low-level voltage VSS, and the voltage difference between two ends of the light-emitting device 100. Therefore, the threshold voltage shift of the second driving transistor DT' due to the operation during the emission segment ES' may have a certain degree of recovery during the recovery segment RCS'.

Figure 4C:
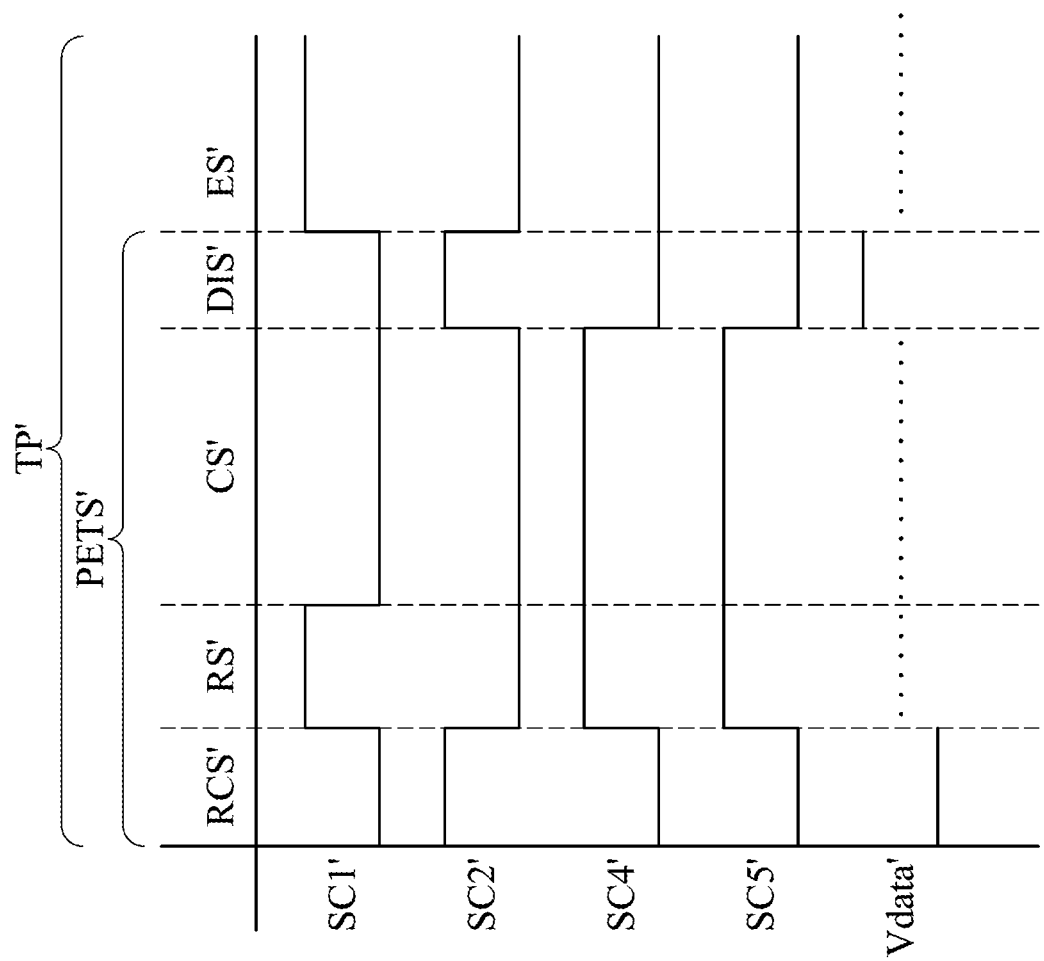
FIG. 4C is a timing diagram of operations in the second time period for the second driving circuit according to some embodiments of the present disclosure.

Reference is made to FIG. 4C. The difference between embodiments as shown in FIG. 4C and the embodiments as shown in FIG. 4B is that the gate voltage of the second driving transistor DT' for said recovery is applied by the second data voltage Vdata'. A combination of enablement and disablement of the second reset circuit 200', the second compensation circuit 300', and second the data circuit 400' during the recovery segment RCS' in the embodiments illustrated by FIG. 4C can be the same as that during the data input segment DIS', except that a voltage level of the second data voltage Vdata' during the recovery segment RCS' is lower than the sum of the voltage levels of the threshold voltage Vth' of the second driving transistor DT', the low-level voltage VSS, and the voltage difference between two ends of the light-emitting device 100.

Figure 4D:
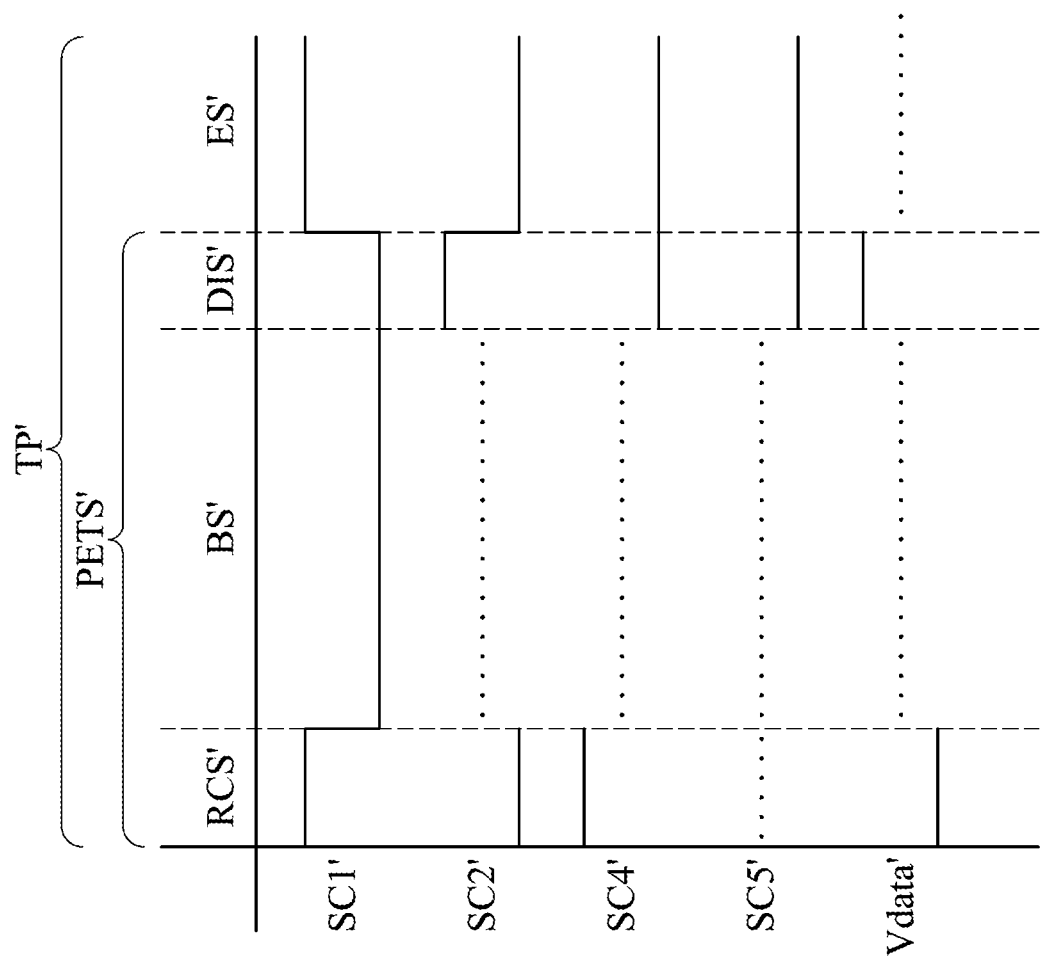
FIG. 4D is a timing diagram of operations in the second time period for the second driving circuit according to some embodiments of the present disclosure.

Reference is made to FIG. 4D. The difference between embodiments as shown in FIG. 4D and the embodiments as shown in FIG. 4C is that the second pre-emission time segment PETS' in FIG. 4D includes only the recovery segment RCS', the blank segment BS', and the data input segment DIS'. The reset segment RS' and the compensation segment CS' are not included in the second pre-emission time segment PETS'. It can be understood that not every frame needs compensation within one pixel.

Figure 4E:
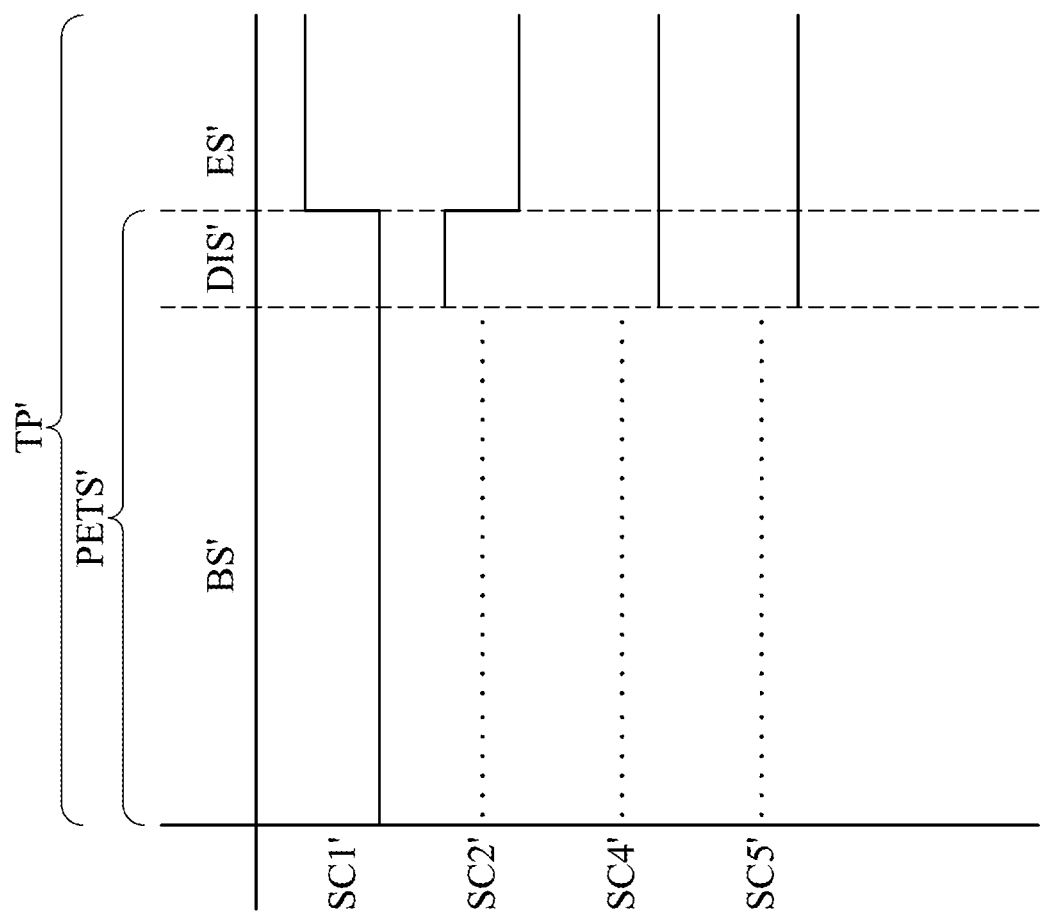
FIG. 4E is a timing diagram of operations in the second time period for the second driving circuit according to some embodiments of the present disclosure.

Reference is made to FIG. 4E. In some embodiments, the second pre-emission time segment PETS' only includes the blank segment BS' and the data input segment DIS', which means the second compensation circuit 300' and the second data circuit 400' can be kept in states the same as those at the end of the previous operation during the blank segment BS', no matter they are enabled or disabled, while the second reset circuit 200' is disabled during the blank segment BS'.

Figure 4F:
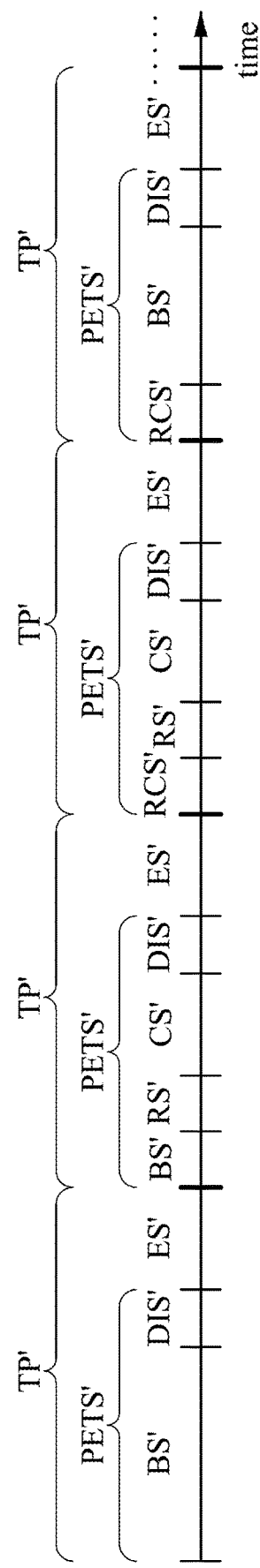
FIG. 4F is a timing diagram of a combination of operations in the second time period for the second driving circuit according to some embodiments of the present disclosure.

Reference is made to FIG. 4F. FIG. 4F is a timing diagram of a combination of operations in the second time period TP' for the second driving circuit 1000' according to some embodiments of the present disclosure. Embodiments illustrated by FIG. 4F exemplifies a combination of four of different second pre-emission time segments PETS' and four of different second emission time segments ES' operated in sequence. First of the second pre-emission time segment PETS' includes the blank segment BS' and the data input segment DIS'. Second of the second pre-emission time segment PETS' includes the blank segment BS', the reset segment RS', the compensation segment CS', and the data input segment DIS'. Third of the second pre-emission time segment PETS' includes the recovery segment RCS', the reset segment RS', the compensation segment CS', and the data input segment DIS'. Fourth of the second pre-emission time segment PETS' includes the recovery segment RCS', the blank segment BS', and the data input segment DIS'. Although the embodiments illustrated by FIG. 4F only shows one example of the combination, it should not be limited thereto. Other embodiments with different type of combinations using the blank segment BS', the recovery segment RCS', the reset segment RS', the compensation segment CS', and the data input segment DIS' are also within the scope of the present disclosure.

Reference is made to FIGS. 5A to 5D. FIGS. 5A to 5D are respectively timing diagrams of operations in both the first time period TP and the second time period TP' respectively for the first driving circuit 1000 and the second driving circuit 1000' according to some embodiments of the present disclosure. The first time period TP and the second time period TP' are present on the same timeline to explicitly show time relations between thereof, and thus synergetic effects resulted from the combination of the first driving circuit 1000 and the second driving circuit 1000' can be derived and verified according to the following embodiments and timing diagrams as shown in FIGS. 5A to 5D.

Figure 5A:
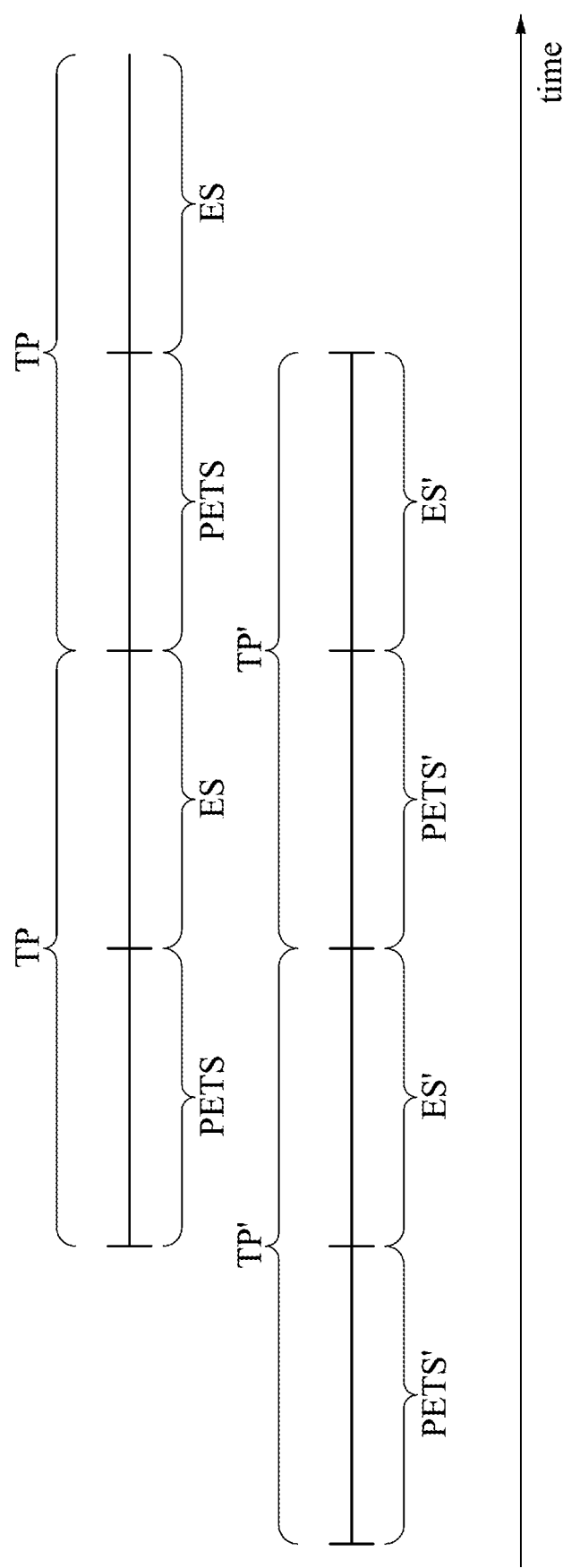
FIG. 5A is a timing diagram of operations in both the first time period and the second time period respectively for the first driving circuit and the second driving circuit according to some embodiments of the present disclosure.

Reference is made to FIG. 5A. In some embodiments, the first emission time segment ES does not overlap with the second emission time segment ES', which means the light-emitting device 100 is driven alternately by the first driving circuit 1000 and the second driving circuit 1000'. In some embodiments, the first emission time segment ES is immediately followed by the second emission time segment ES'. The first emission time segment ES and the second emission time segment ES' can be repeated alternately in sequence. In some embodiments, the first pre-emission time segment PETS is overlapped with the second emission time segment ES', and the second pre-emission time segment PETS' is overlapped with the first emission time segment ES. Therefore, threshold voltage shifts in both the first driving transistor DT and the second driving transistor DT' can be better recovered. Besides, when viewed in combination of FIG. 1, the reset circuit 200 of the first driving circuit 1000 and the reset circuit 200' of the second driving circuit 1000' can act as switches inherently to determine which of the first driving circuit 1000 and the second driving circuit 1000' is used to drive the light-emitting device 100. There is no need to add other switches to the alternating self-compensation circuit 1 for said determination.

Figure 5B:
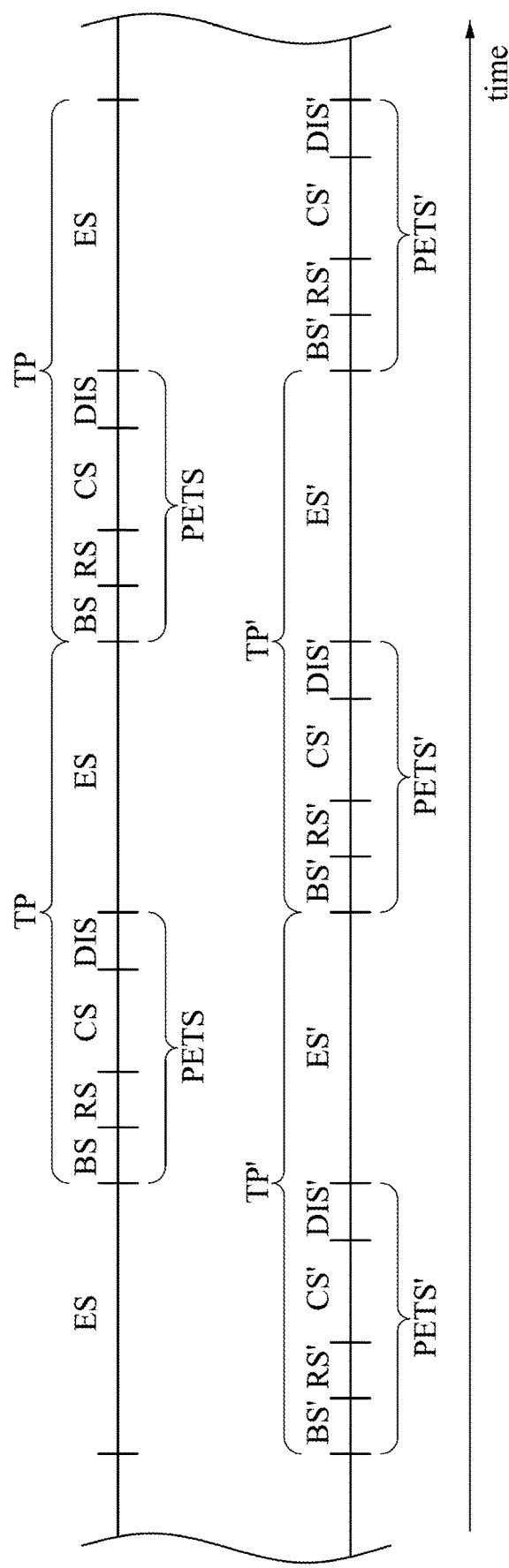
FIG. 5B is a timing diagram of operations in both the first time period and the second time period respectively for the first driving circuit and the second driving circuit according to some embodiments of the present disclosure.
Figure 5C:
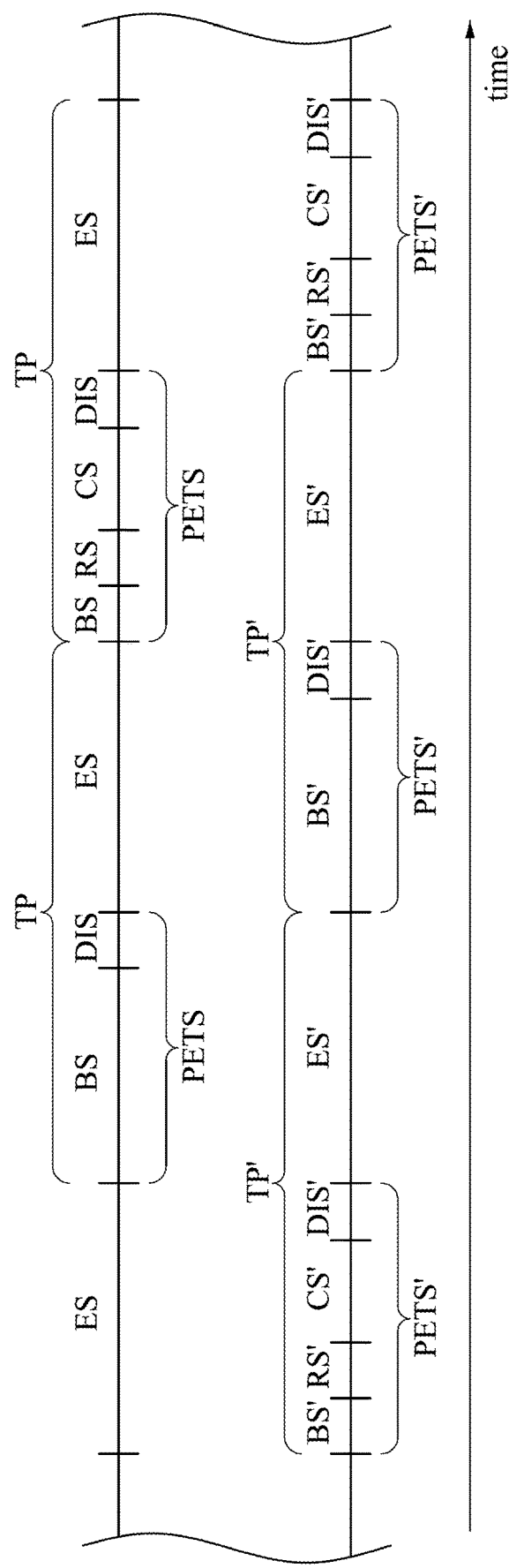
FIG. 5C is a timing diagram of operations in both the first time period and the second time period respectively for the first driving circuit and the second driving circuit according to some embodiments of the present disclosure.
Figure 5D:
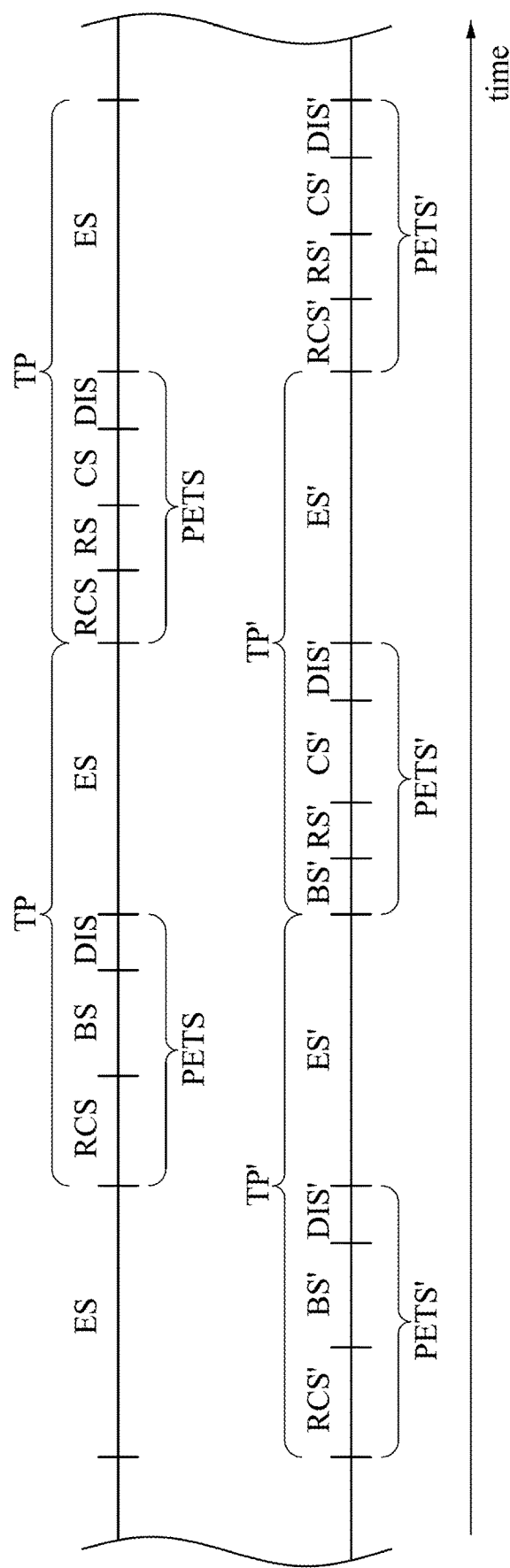
FIG. 5D is a timing diagram of operations in both the first time period and the second time period respectively for the first driving circuit and the second driving circuit according to some embodiments of the present disclosure.

Reference is made to FIGS. 5B to 5D. In some embodiments, the first pre-emission time segment PETS and the first emission time segment ES are repeated alternately in sequence, and the second pre-emission time segment PETS' and the second emission time segment (ES') are repeated alternately in sequence. In some embodiments, each of the first pre-emission time segments PETS include the blank segment BS, the reset segment RS, the compensation segment CS, and the data input segment DIS, and each of the second pre-emission time segments PETS' include the blank segment BS', the reset segment RS', the compensation segment CS', and the data input segment DIS' (as referred to FIG. 5B). In some embodiments, some of the first pre-emission time segments PETS include the blank segment BS and the data input segment DIS, some of the first pre-emission time segments PETS include the blank segment BS, the reset segment RS, the compensation segment CS, and the data input segment DIS; some of the second pre-emission time segments PETS' include the blank segment BS' and the data input segment DIS', some of the second pre-emission time segments PETS' include the blank segment BS', the reset segment RS, the compensation segment CS', and the data input segment DIS' (as referred to FIG. 5C). In some embodiments, some of the first pre-emission time segments PETS include the recovery segment RCS, the blank segment BS, and the data input segment DIS, some of the first pre-emission time segments PETS include the recovery segment, the reset segment RS, the compensation segment CS, and the data input segment DIS; some of the second pre-emission time segments PETS' include the recovery segment RCS', the blank segment BS', and the data input segment DIS', some of the second pre-emission time segments PETS' include the blank segment BS', the reset segment RS', the compensation segment CS', and the data input segment DIS', some of the second pre-emission time segments PETS' include the recovery segment RCS', the reset segment RS', the compensation segment CS', and the data input segment DIS'(as referred to FIG. 5D). Embodiments illustrated by FIGS. 5B to 5D are only for exemplifications, and other possible combinations which can be derived from FIG. 1 and FIGS. 4A to 4F and contents from previous paragraphs are also within the scope of the present disclosure.

Figure 6:
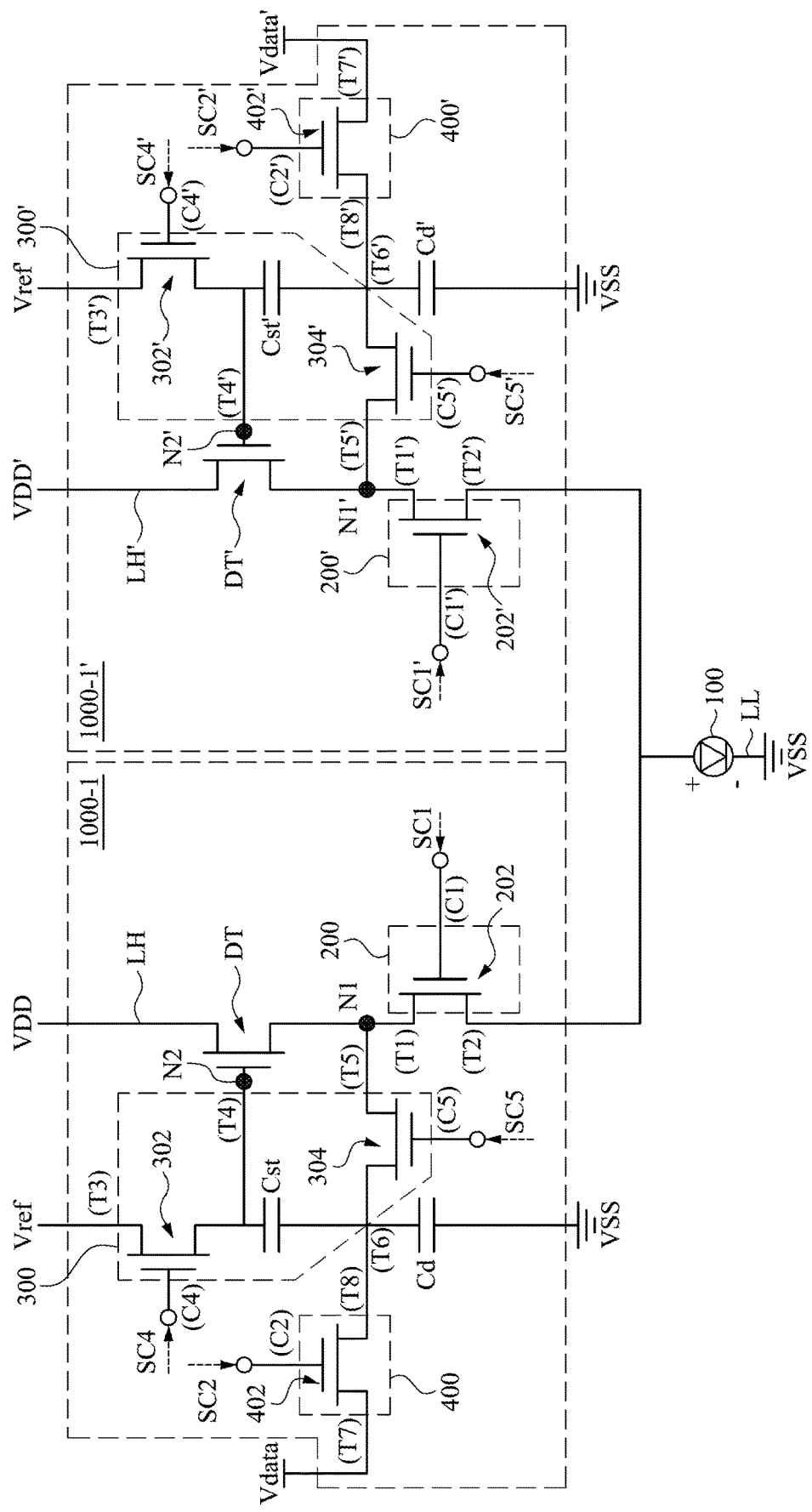
FIG. 6 is a schematic diagram of an alternating self-compensation circuit including a first driving circuit and a second driving circuit according to some embodiments of the present disclosure.
Figure 7A:
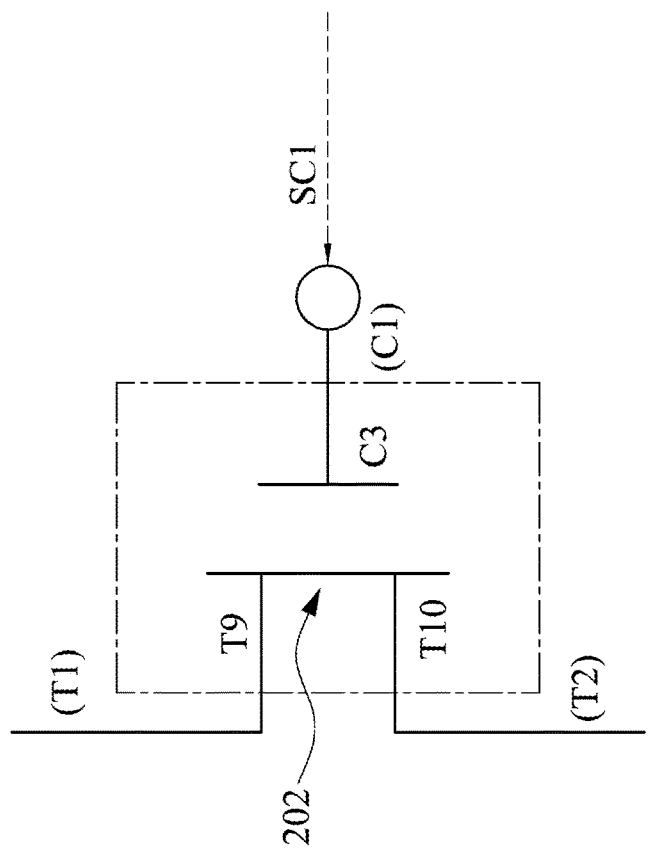
FIG. 7A is a schematic diagram of the first reset circuit according to some embodiments of the present disclosure.
Figure 7B:
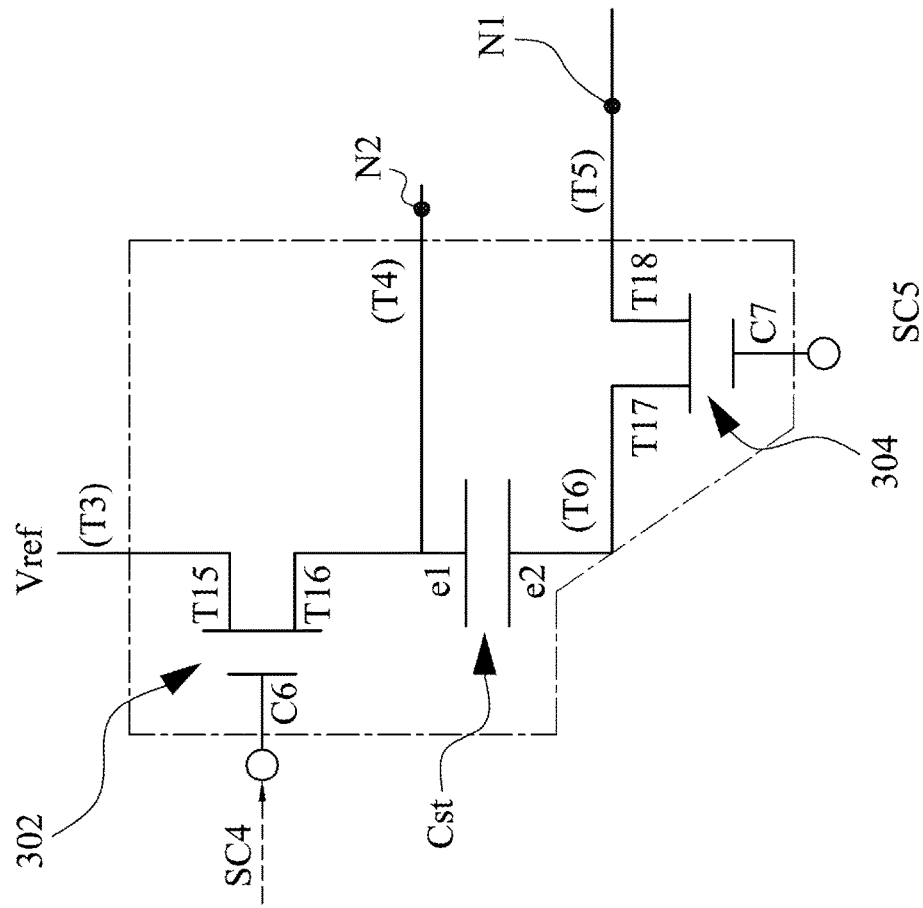
FIG. 7B is a schematic diagram of the first compensation circuit according to some embodiments of the present disclosure.
Figure 7C:
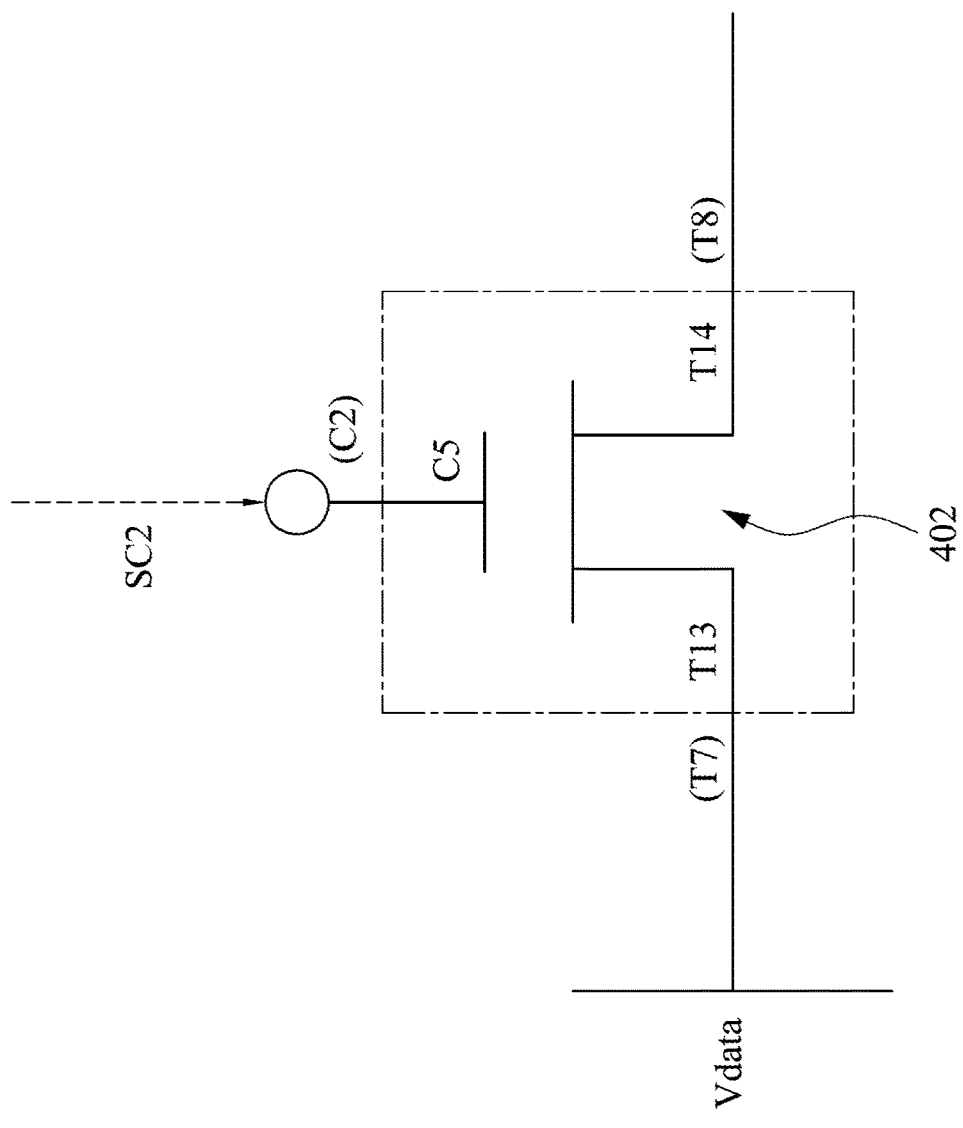
FIG. 7C is a schematic diagram of the first data circuit according to some embodiments of the present disclosure.

Reference is made to FIGS. 6, 7A to 7C, 8A to 8C, and 9A to 9D. FIG. 6 is a schematic diagram of an alternating self-compensation circuit 1-1 including a first driving circuit 1000-1 and a second driving circuit 1000-1' according to some embodiments of the present disclosure. FIG. 7A is a schematic diagram of the first reset circuit 200 according to some embodiments of the present disclosure. FIG. 7B is a schematic diagram of the first compensation circuit 300 according to some embodiments of the present disclosure. FIG. 7C is a schematic diagram of the first data circuit 400 according to some embodiments of the present disclosure.

In some embodiments, the first reset circuit 200 includes a switching transistor 202. The switching transistor 202 has terminals T9 and T10, and a control terminal C3 (referred to FIG. 7A). The terminal T9 is electrically connected to the first driving transistor DT through the first node N1, and the second terminal T10 is electrically connected to the light-emitting device 100. The control terminal C3 is configured to receive the scan signal SC1. In some embodiments, the terminal T9 of the switching transistor 202 serves as the terminal T1 of the first reset circuit 200, the terminal T10 of the switching transistor 202 serves as the terminal T2 of the first reset circuit 200, and the control terminal C3 of the switching transistor 202 serves as the control terminal C1 of the first reset circuit 200. During the reset segment RS and the emission segment ES, the switching transistor 202 is enabled by the scan signal SC1 to allow a current to flow from the first node N1 to the low-level voltage line LL through the light-emitting device 100. During the compensation segment CS, the switching transistor 202 is disabled by the scan signal SC1, and there is substantially no current flowing through the light-emitting device 100. During the recovery segment RCS which uses the first reference voltage Vref to recover the threshold voltage shift of the first driving transistor DT, the switching transistor 202 is enabled by the scan signal SC1, and during the recovery segment RCS which uses the first data voltage Vdata to recover the threshold voltage shift of the first driving transistor DT, the switching transistor 202 is also disabled by the scan signal SC1.

In some embodiments, the first compensation circuit 300 includes a storage capacitor Cst, a switching transistor 302, and a switching transistor 304 (referred to FIG. 7B). The storage capacitor Cst has a first end e1 and a second end e2. The switching transistor 302 has terminals T15 and T16, and a control terminal C6. The terminal T15 is electrically connected to the first reference voltage Vref. The terminal T16 is electrically connected to the first end e1 of the storage capacitor Cst and the second node N2. The control terminal C6 is configured to receive the scan signal SC4. The switching transistor 304 has terminals T17 and T18 and a control terminal C7. The terminal T17 is electrically connected to the second end e2 of the storage capacitor Cst and one end of the first delivery capacitor Cd which is different from the end of the first delivery capacitor Cd electrically connected to the low-level voltage VSS. The terminal T18 is electrically connected to the first node N1. The control terminal C7 is configured to receive the scan signal SC5. In some embodiments, the terminal T15 of the switching transistor 302 serves as the terminal T3 of the first compensation circuit 300, the terminal T16 of the switching transistor 302 and the first end e1 of the storage capacitor Cst serves as the terminal T4 of the first compensation circuit 300, the terminal T18 of the switching transistor 304 serves as the terminal T5 of the first compensation circuit 300, and the terminal T17 of the switching transistor 304 serves as the terminal T6 of the first compensation circuit 300. During the reset segment RS and the compensation segment CS, the switching transistor 302 and the switching transistor 304 are enabled respectively by the scan signal SC4 and the scan signal SC5, such that the first reference voltage Vref is applied to modulate the gate voltage of the first driving transistor DT during the reset segment RS, and a voltage difference between the first end e1 and the second end e2 of the storage capacitor Cst approaches the threshold voltage Vth of the first driving transistor DT at the end of the compensating segment CS. During the data input segment DIS, the switching transistor 302 is disabled by the scan signal SC4, and the switching transistor 304 is disabled by the scan signal SC5, such that the first reference voltage Vref is disallowed to be applied to the first driving transistor DT, and a voltage difference between two ends of the first delivery capacitor Cd is substantially equal to the first data voltage Vdata. During the emission segment ES, the switching transistor 302 and the switching transistor 304 are disabled respectively by the scan signal SC4 and the scan signal SC5, such that the threshold voltage Vth of the first driving transistor DT and the first data voltage Vdata respectively stored in the storage capacitor Cst and the first delivery capacitor Cd are applied to modulate the gate voltage of the first driving transistor DT.

During the recovery segment RCS, one way to recover the threshold voltage shift of the first driving transistor DT is as follows. The switching transistor 302 is enabled by the scan signal SC4 such that the first reference voltage Vref with a voltage level lower than the sum of the voltage levels of the low-level voltage VSS, the threshold voltage Vth of the first driving transistor DT, and the voltage difference between two ends of the light-emitting device 100 is applied to modulate the gate voltage of the first driving transistor DT. Another way to recover the threshold voltage shift of the first driving transistor DT is to use the first data voltage Vdata instead of the first reference voltage Vref. In such a case, the switching transistor 302 and the switching transistor 304 of the compensation circuit 300 are disabled such that the first reference voltage Vref is disallowed to be applied to the second node N2, and the first data voltage Vdata is disallowed to be applied to the first node N1.

It is noted that from FIGS. 3A to 3E the scan signals SC4 and SC5 are substantially the same. As a result, in order to save space for a circuit layout, the scan signals SC4 and SC5 can be the same scan signal. That is, the terminals C4 and C5 of the first compensation circuit 300 (or the control terminal C6 of the switching transistor 302 and the control terminal C7 of the switching transistor 304, which are equivalent in the embodiments as illustrated by FIGS. 6 and 7B) can be electrically connected to the same scan line in some embodiments.

In some embodiments, the first data circuit 400 includes a switching transistor 402 (referred to FIG. 7C). The switching transistor 402 has terminals T13 and T14 and a control terminal C5. The terminal T13 is electrically connected to the first data voltage Vdata. The terminal T14 is electrically connected to the terminal T6 of the first compensation circuit 300 and one end of the first delivery capacitor Cd which is different from the end of the first delivery capacitor Cd electrically connected to the low-level voltage VSS. The control terminal C5 is configured to receive the scan signal SC2. In some embodiments, the terminal T13 of the switching transistor 402 serves as the terminal T7 of the first data circuit 400, the terminal T14 of the switching transistor 402 serves as the terminal T8 of the data circuit 400, and the control terminal C5 of the switching transistor 402 serves as the control terminal C2 of the first data circuit 400. During the reset segment RS, the compensation segment CS, and the emission segment ES, the switching transistor 402 is disabled by the scan signal SC2. During the data input segment DIS, the switching transistor 402 is enabled by the scan signal SC2 to control the gate voltage of the first driving transistor DT according to the first data voltage Vdata. During the recovery segment RCS which uses the first reference voltage Vref to recover the threshold voltage shift of the first driving transistor DT, the switching transistor 402 is disabled by the scan signal SC2. During the recovery segment RCS which uses the first data voltage Vdata to recover the threshold voltage shift of the first driving transistor DT, the switching transistor 402 is enabled by the scan signal SC2, and the first data voltage Vdata with a voltage level lower than the voltage level of the sum of the voltage level of the threshold voltage Vth of the first driving transistor DT, the low-level voltage VSS, and the voltage difference between two ends of the light-emitting device 100 is applied to recover the threshold voltage shift of the first driving transistor DT.

Figure 8A:
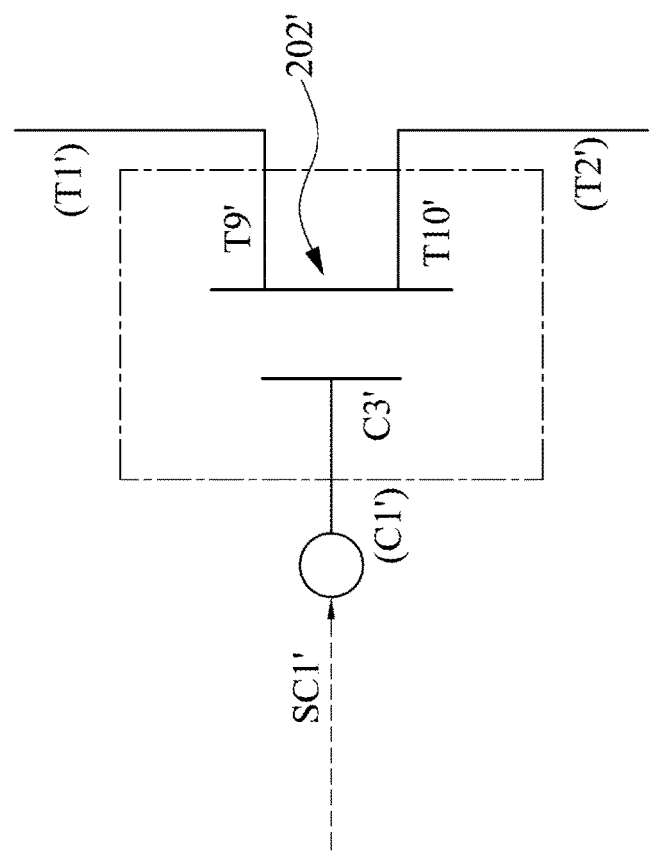
FIG. 8A is a schematic diagram of the second reset circuit according to some embodiments of the present disclosure.
Figure 8B:
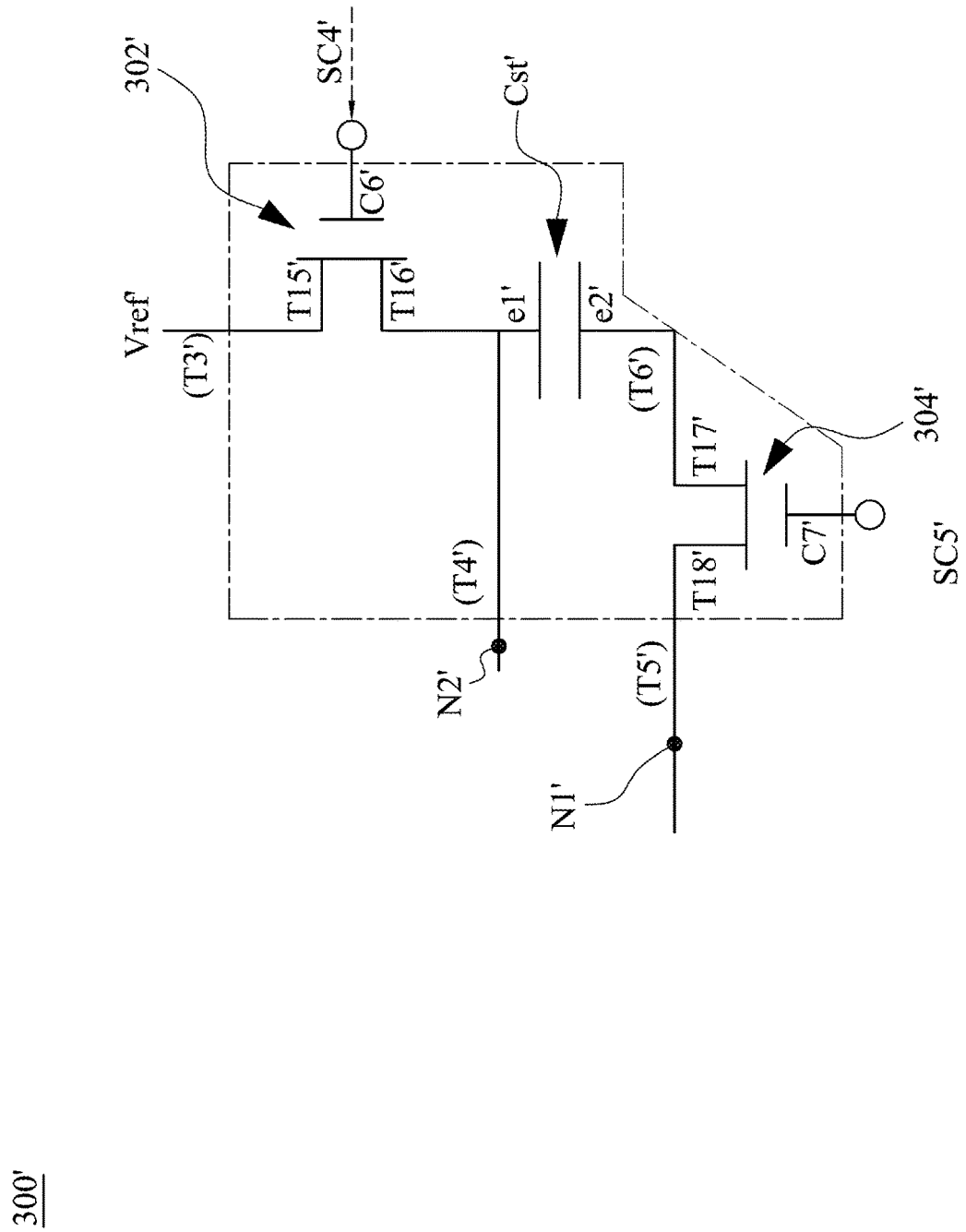
FIG. 8B is a schematic diagram of the second compensation circuit according to some embodiments of the present disclosure.
Figure 8C:
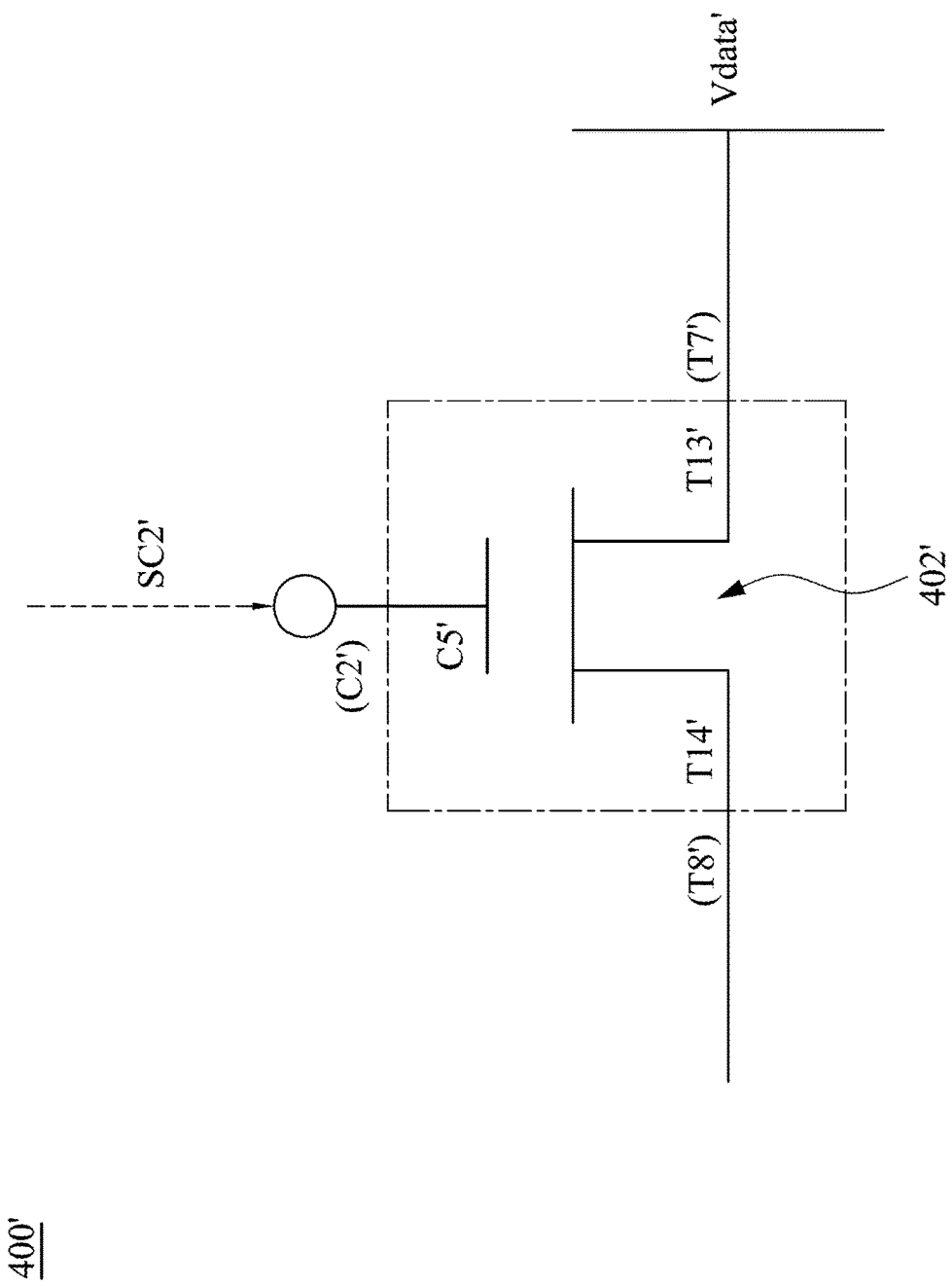
FIG. 8C is a schematic diagram of the second data circuit according to some embodiments of the present disclosure.

FIG. 8A is a schematic diagram of the second reset circuit 200' according to some embodiments of the present disclosure. FIG. 8B is a schematic diagram of the second compensation circuit 300' according to some embodiments of the present disclosure. FIG. 8C is a schematic diagram of the second data circuit 400' according to some embodiments of the present disclosure.

In some embodiments, the second reset circuit 200' includes a switching transistor 202'. The switching transistor 202' has terminals T9' and T10', and a control terminal C3' (referred to FIG. 8A). The terminal T9' is electrically connected to the second driving transistor DT' through the third node N1', and the second terminal T10' is electrically connected to the light-emitting device 100. The control terminal C3' is configured to receive the scan signal SC1'. In some embodiments, the terminal T9' of the switching transistor 202' serves as the terminal T1' of the second reset circuit 200', the terminal T10' of the switching transistor 202' serves as the terminal T2' of the second reset circuit 200', and the control terminal C3' of the switching transistor 202' serves as the control terminal C1' of the second reset circuit 200'. During the reset segment RS' and the emission segment ES', the switching transistor 202' is enabled by the scan signal SC1' to allow a current to flow from the third node N1' to the low-level voltage line LL through the light-emitting device 100. During the compensation segment CS', the switching transistor 202' is disabled by the scan signal SC1', and there is substantially no current flowing through the light-emitting device 100. During the recovery segment RCS' which uses the second reference voltage Vref' to recover the threshold voltage shift of the second driving transistor DT', the switching transistor 202' is enabled by the scan signal SC1', and during the recovery segment RCS' which uses the second data voltage Vdata' to recover the threshold voltage shift of the second driving transistor DT', the switching transistor 202' is also disabled by the scan signal SC1'.

In some embodiments, the second compensation circuit 300' includes a storage capacitor Cst', a switching transistor 302', and a switching transistor 304' (referred to FIG. 7B). The storage capacitor Cst' has a first end e1' and a second end e2'. The switching transistor 302' has terminals T15' and T16', and a control terminal C6'. The terminal T15' is electrically connected to the second reference voltage Vref'. The terminal T16' is electrically connected to the first end e1' of the storage capacitor Cst' and the fourth node N2'. The control terminal C6' is configured to receive the scan signal SC4'. The switching transistor 304' has terminals T17' and T18' and a control terminal C7'. The terminal T17' is electrically connected to the second end e2' of the storage capacitor Cst' and one end of the second delivery capacitor Cd' which is different from the end of the second delivery capacitor Cd' electrically connected to the low-level voltage VSS. The terminal T18' is electrically connected to the third node N1'. The control terminal C7' is configured to receive the scan signal SC5'. In some embodiments, the terminal T15' of the switching transistor 302' serves as the terminal T3' of the second compensation circuit 300', the terminal T16' of the switching transistor 302' and the first end e1' of the storage capacitor Cst' serves as the terminal T4' of the second compensation circuit 300', the terminal T18' of the switching transistor 304' serves as the terminal T5' of the second compensation circuit 300', and the terminal T17' of the switching transistor 304' serves as the terminal T6' of the second compensation circuit 300'. During the reset segment RS' and the compensation segment CS', the switching transistor 302' and the switching transistor 304' are enabled respectively by the scan signal SC4' and the scan signal SC5', such that the second reference voltage Vref' is applied to modulate the gate voltage of the second driving transistor DT' during the reset segment RS', and a voltage difference between the first end e1' and the second end e2' of the storage capacitor Cst' approaches the threshold voltage Vth' of the second driving transistor DT' at the end of the compensating segment CS'. During the data input segment DIS', the switching transistor 302' is disabled by the scan signal SC4', and the switching transistor 304' is disabled by the scan signal SC5', such that the second reference voltage Vref' is disallowed to be applied to the second driving transistor DT', and a voltage difference between two ends of the second delivery capacitor Cd' is substantially equal to the second data voltage Vdata'. During the emission segment ES', the switching transistor 302' and the switching transistor 304' are disabled respectively by the scan signal SC4' and the scan signal SC5', such that the threshold voltage Vth' of the second driving transistor DT' and the second data voltage Vdata' respectively stored in the storage capacitor Cst' and the second delivery capacitor Cd' are applied to modulate the gate voltage of the second driving transistor DT'.

During the recovery segment RCS', one way to recover the threshold voltage shift of the second driving transistor DT' is as follows. The switching transistor 302' is enabled by the scan signal SC4' such that the second reference voltage Vref' with a voltage level lower than the sum of the voltage levels of the low-level voltage VSS, the threshold voltage Vth' of the second driving transistor DT', and the voltage difference between two ends of the light-emitting device 100 is applied to modulate the gate voltage of the second driving transistor DT'. Another way to recover the threshold voltage shift of the second driving transistor DT' is to use the second data voltage Vdata' instead of the second reference voltage Vref'. In such a case, the switching transistor 302' and the switching transistor 304' of the compensation circuit 300' are disabled such that the second reference voltage Vref' is disallowed to be applied to the fourth node N2', and the second data voltage Vdata' is disallowed to be applied to the third node N1'.

It is noted that from FIGS. 4A to 4E the scan signals SC4' and SC5' are substantially the same. As a result, in order to save space for a circuit layout, the scan signals SC4' and SC5' can be the same scan signal. That is, the terminals C4' and C5' of the second compensation circuit 300' (or the control terminal C6' of the switching transistor 302' and the control terminal C7' of the switching transistor 304', which are equivalent in the embodiments as illustrated by FIGS. 6 and 8B) can be electrically connected to the same scan line in some embodiments.

In some embodiments, the second data circuit 400' includes a switching transistor 402' (referred to FIG. 8C). The switching transistor 402' has terminals T13' and T14' and a control terminal C5'. The terminal T13' is electrically connected to the second data voltage Vdata'. The terminal T14' is electrically connected to the terminal T6' of the second compensation circuit 300' and one end of the second delivery capacitor Cd' which is different from the end of the second delivery capacitor Cd' electrically connected to the low-level voltage VSS. The control terminal C5' is configured to receive the scan signal SC2'. In some embodiments, the terminal T13' of the switching transistor 402' serves as the terminal T7' of the second data circuit 400', the terminal T14' of the switching transistor 402' serves as the terminal T8' of the data circuit 400', and the control terminal C5' of the switching transistor 402' serves as the control terminal C2' of the second data circuit 400'. During the reset segment RS', the compensation segment CS', and the emission segment ES', the switching transistor 402' is disabled by the scan signal SC2'. During the data input segment DIS', the switching transistor 402' is enabled by the scan signal SC2' to control the gate voltage of the second driving transistor DT' according to the second data voltage Vdata'. During the recovery segment RCS' which uses the second reference voltage Vref' to recover the threshold voltage shift of the second driving transistor DT', the switching transistor 402' is disabled by the scan signal SC2'. During the recovery segment RCS' which uses the second data voltage Vdata' to recover the threshold voltage shift of the second driving transistor DT', the switching transistor 402' is enabled by the scan signal SC2', and the second data voltage Vdata' with a voltage level lower than the voltage level of the sum of the voltage level of the threshold voltage Vth' of the second driving transistor DT', the low-level voltage VSS', and the voltage difference between two ends of the light-emitting device 100' is applied to recover the threshold voltage shift of the second driving transistor DT'.

Figure 9A:
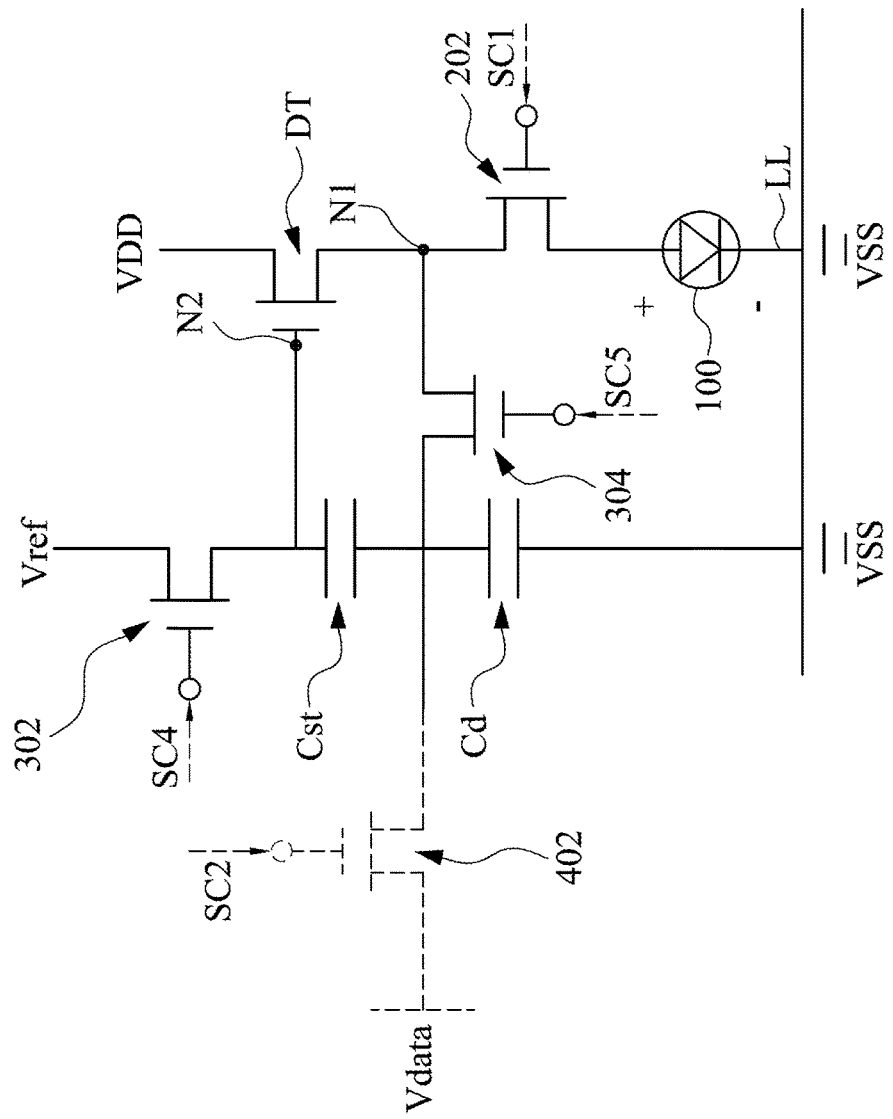
FIG. 9A is a schematic diagram of the first driving circuit operated during the reset segment according to some embodiments of the present disclosure.
Figure 9B:
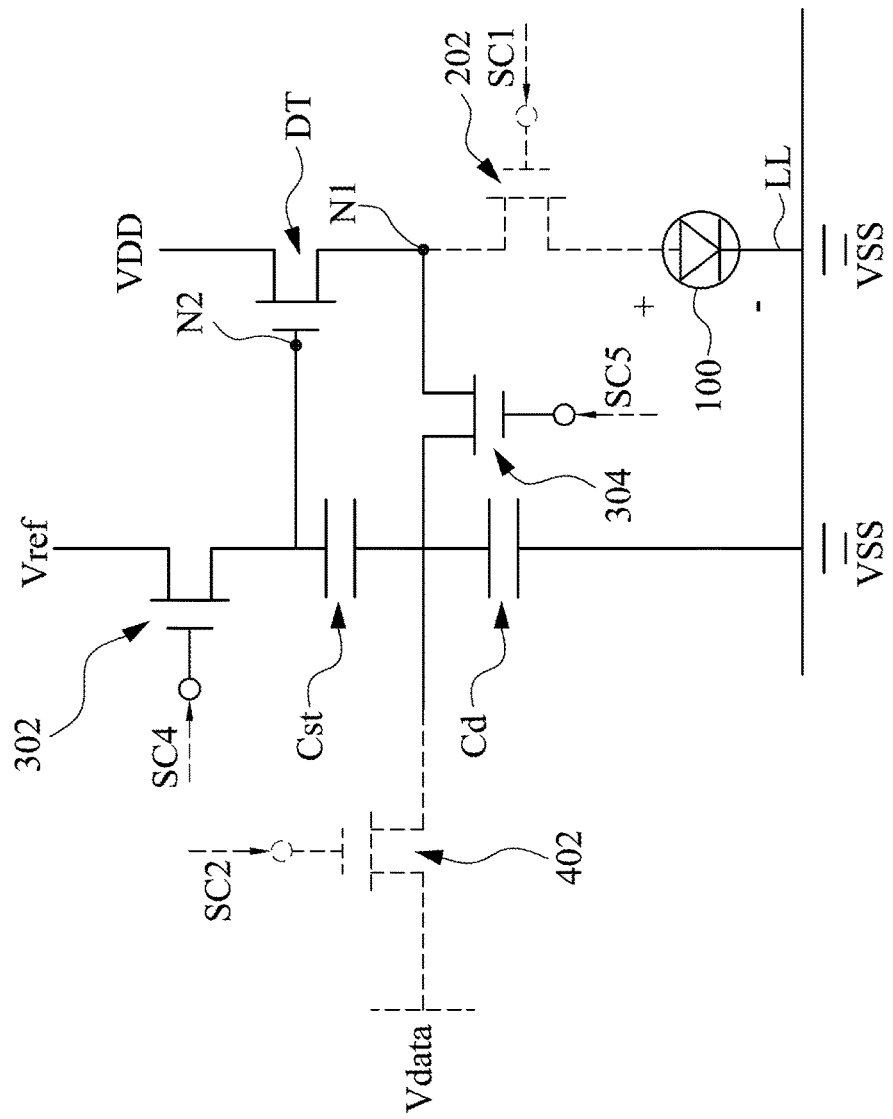
FIG. 9B is a schematic diagram of the first driving circuit operated during the first compensation segment according to some embodiments of the present disclosure.
Figure 9C:
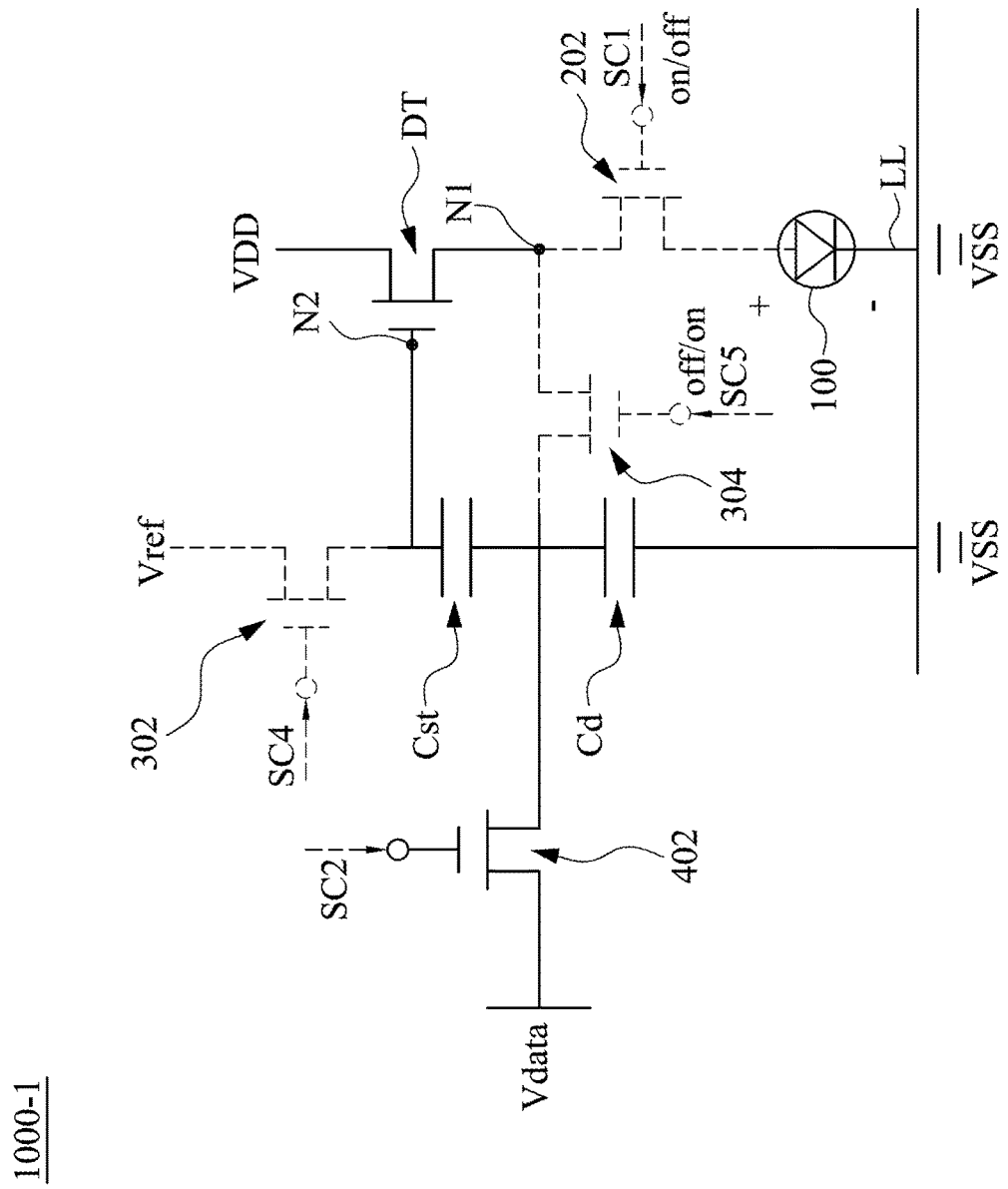
FIG. 9C is a schematic diagram of the first driving circuit operated during the data input segment according to some embodiments of the present disclosure.
Figure 9D:
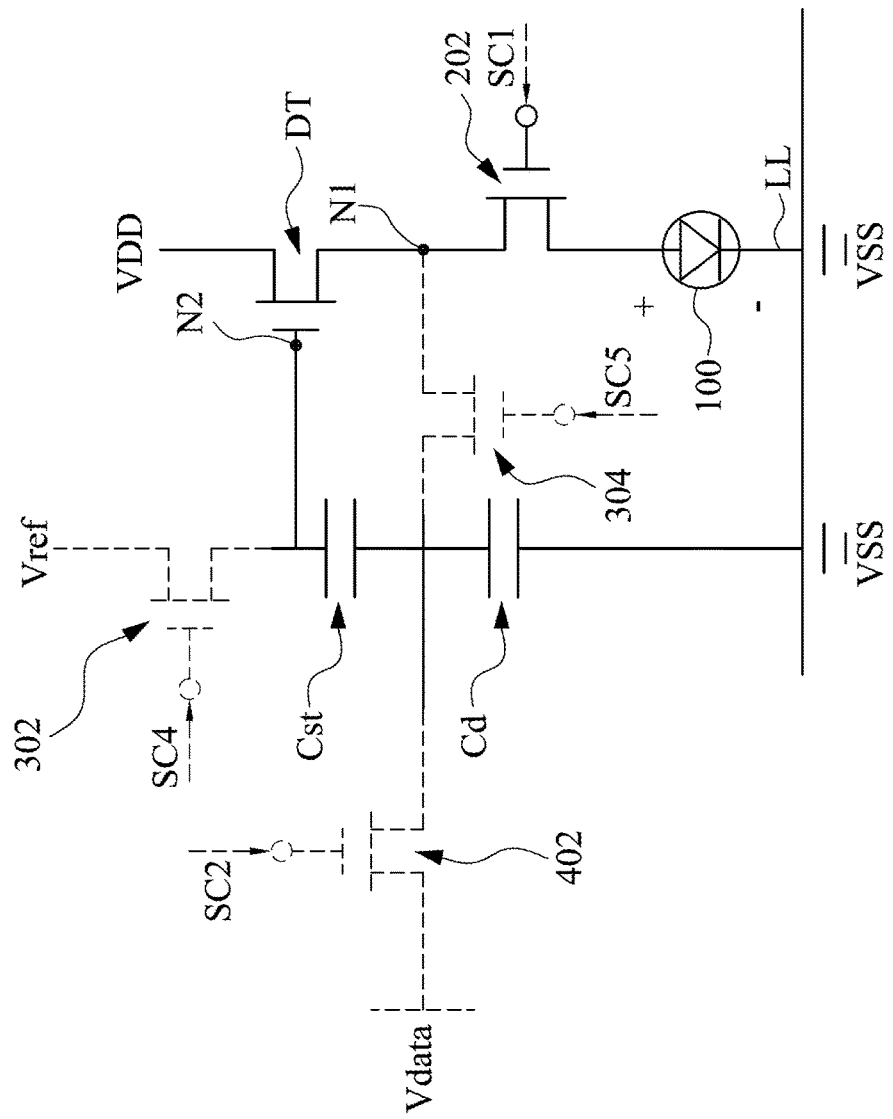
FIG. 9D is a schematic diagram of the first driving circuit operated during the emission segment according to some embodiments of the present disclosure.

FIG. 9A is a schematic diagram of the first driving circuit 1000-1 operated during the reset segment RS according to some embodiments of the present disclosure. FIG. 9B is a schematic diagram of the first driving circuit 1000-1 operated during the compensation segment CS according to some embodiments of the present disclosure. FIG. 9C is a schematic diagram of the first driving circuit 1000-1 operated during the data input segment DIS according to some embodiments of the present disclosure. The word "on/off" for the scan signal SC1 and the word "off/on" for the scan signal SC5 means that besides the embodiments in which a switching transistor 202 and a switching transistor 304 are disabled, there are also other two permissible embodiments. The first embodiment is that the switching transistor 202 is enabled while the switching transistor 304 is disabled. The second embodiment is that the switching transistor 202 is disabled while the switching transistor 304 is enabled. FIG. 9D is a schematic diagram of the first driving circuit 1000-1 operated during the emission segment ES according to some embodiments of the present disclosure. The dotted lines drawn for some of the switching transistors in FIGS. 9A to 9D represent disabled switching transistors, and solid lines drawn for some of the switching transistors in FIGS. 9A to 9D represent enabled switching transistors.

Since operations of the second driving circuit 1000-1' during the reset segment RS', the compensation segment CS', the data input segment DIS', and the emission segment ES' (and also the recovery segment RCS' and the blank segment BS') is similar to that of the first driving circuit 1000-1, figures for the second driving circuit 1000-1' similar to FIGS. 9A to 9D are omitted herein for simplicity.

Figure 10:
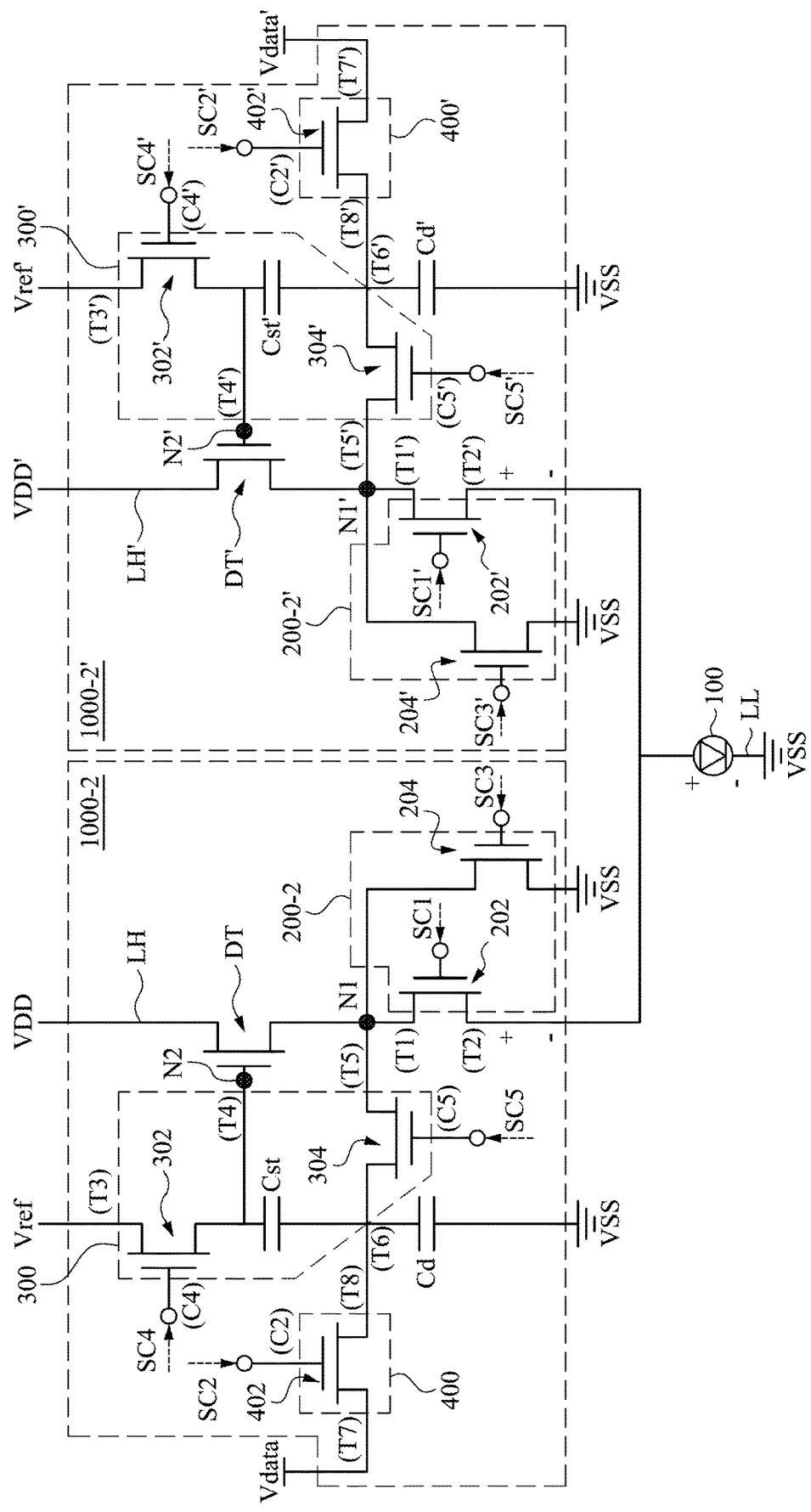
FIG. 10 is a schematic diagram of an alternating self-compensation circuit including a first driving circuit and a second driving circuit according to some embodiments of the present disclosure.
Figure 11A:
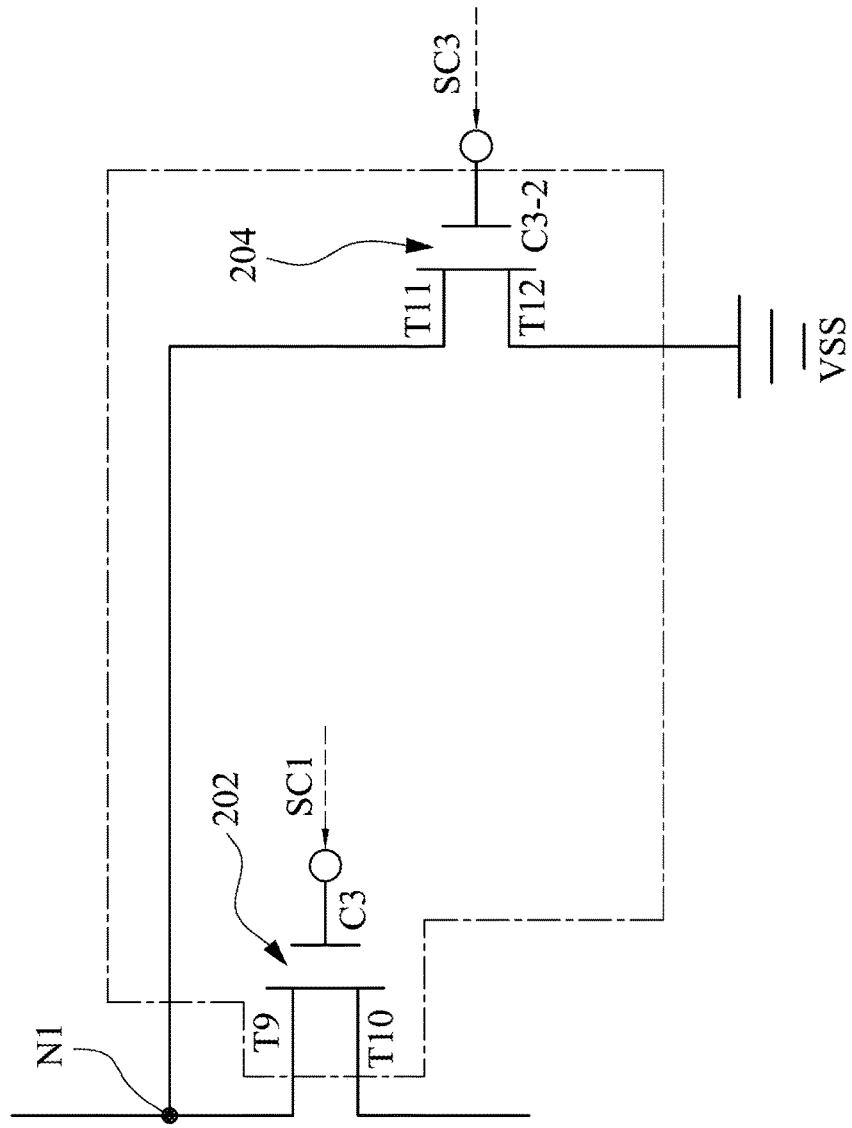
FIG. 11A is a schematic diagram of a first reset circuit according to some embodiments of the present disclosure.
Figure 11B:
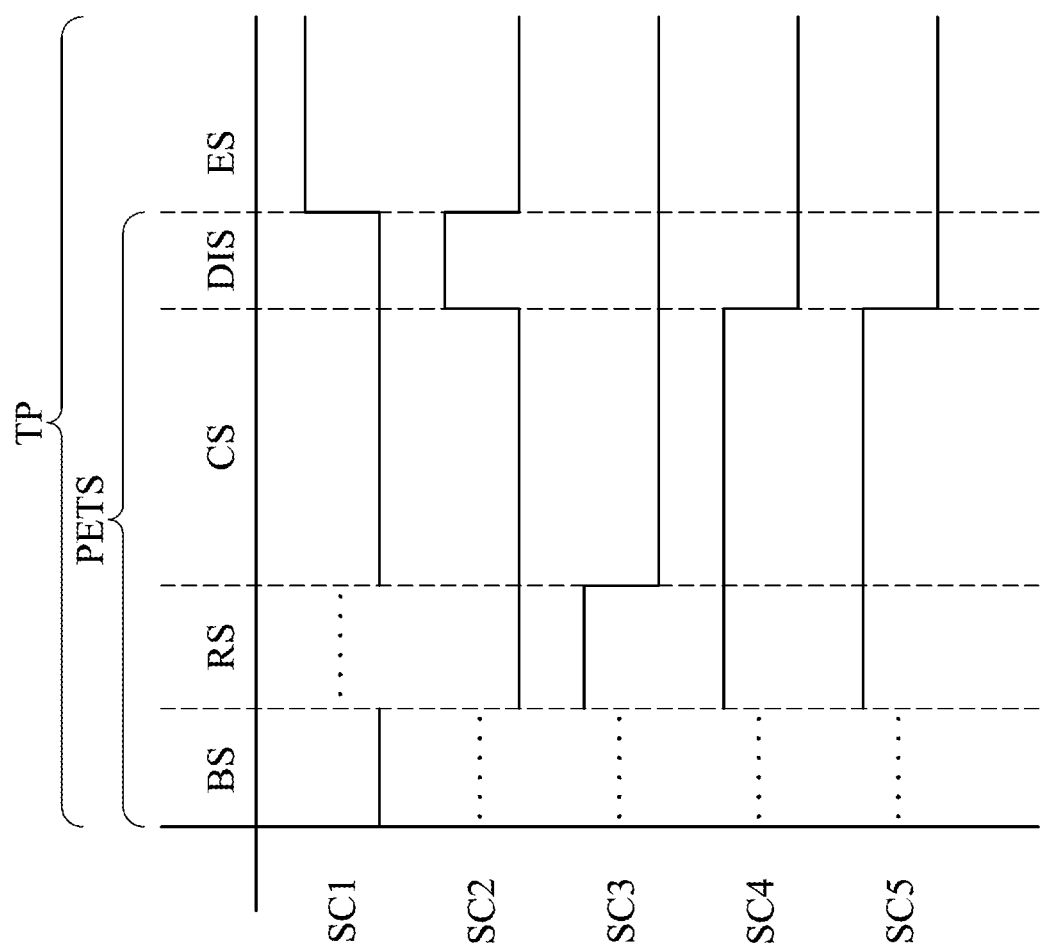
FIG. 11B is a timing diagram of an operation for the first driving circuit according to some embodiments of the present disclosure.
Figure 12A:
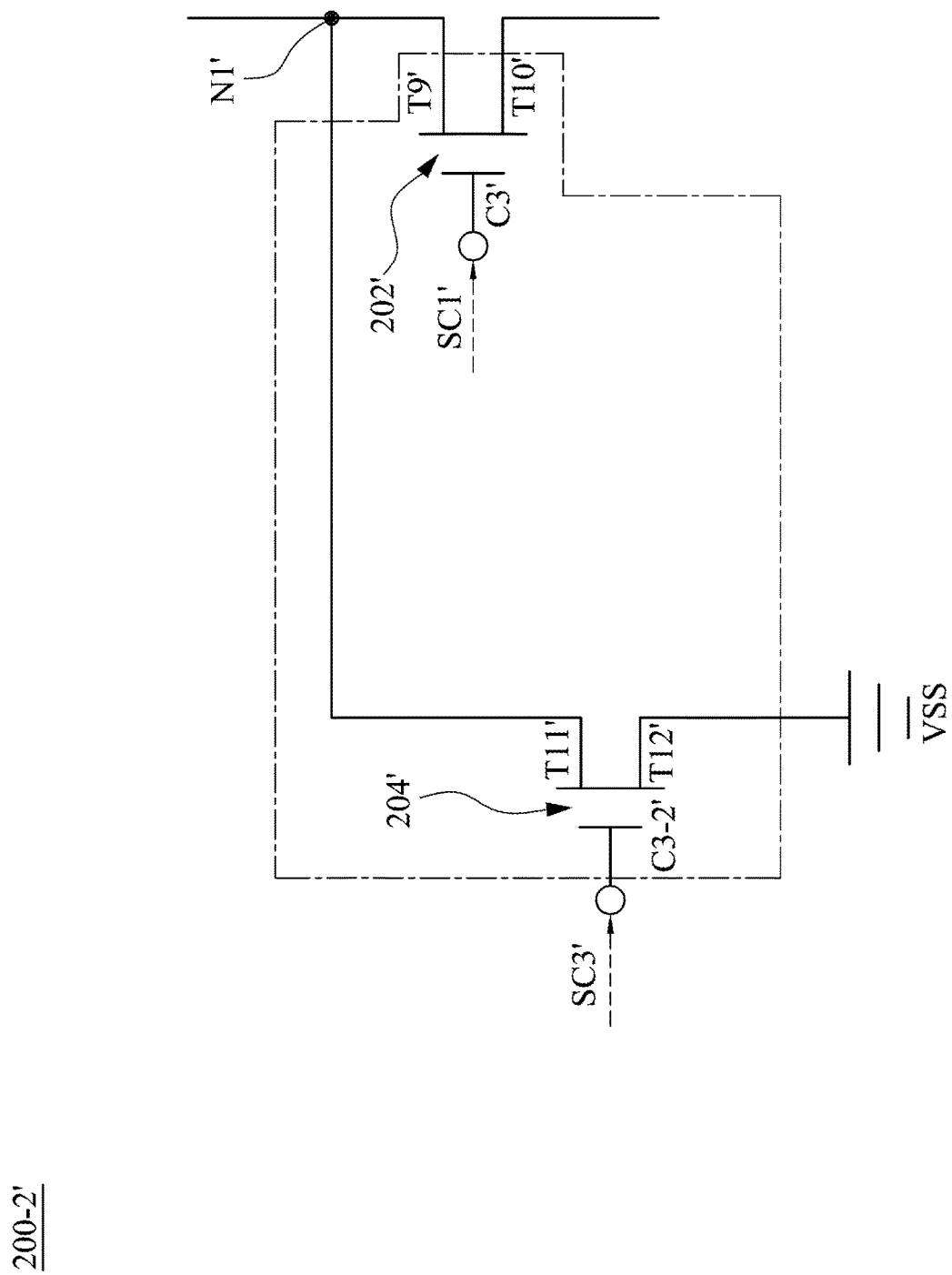
FIG. 12A is a schematic diagram of a second reset circuit according to some embodiments of the present disclosure.
Figure 12B:
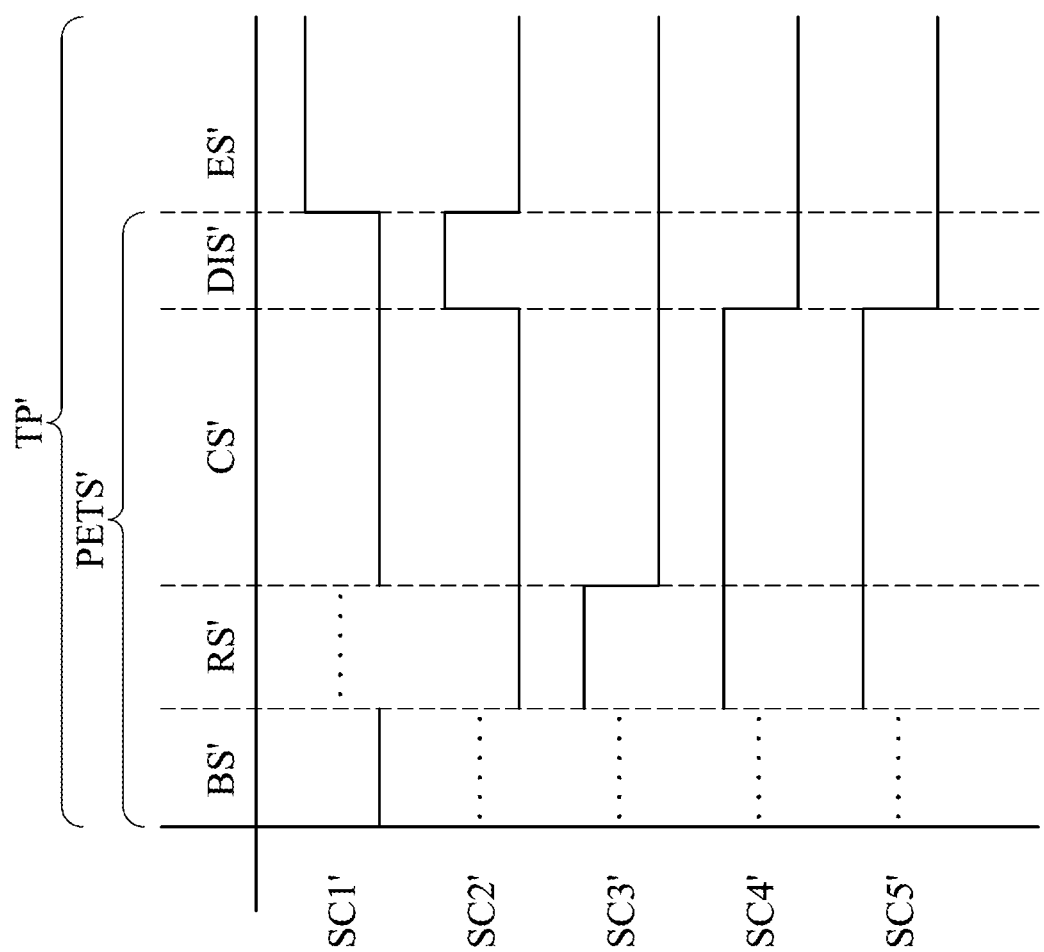
FIG. 12B is a timing diagram of an operation for the second driving circuit according to some embodiments of the present disclosure.
Figure 13A:
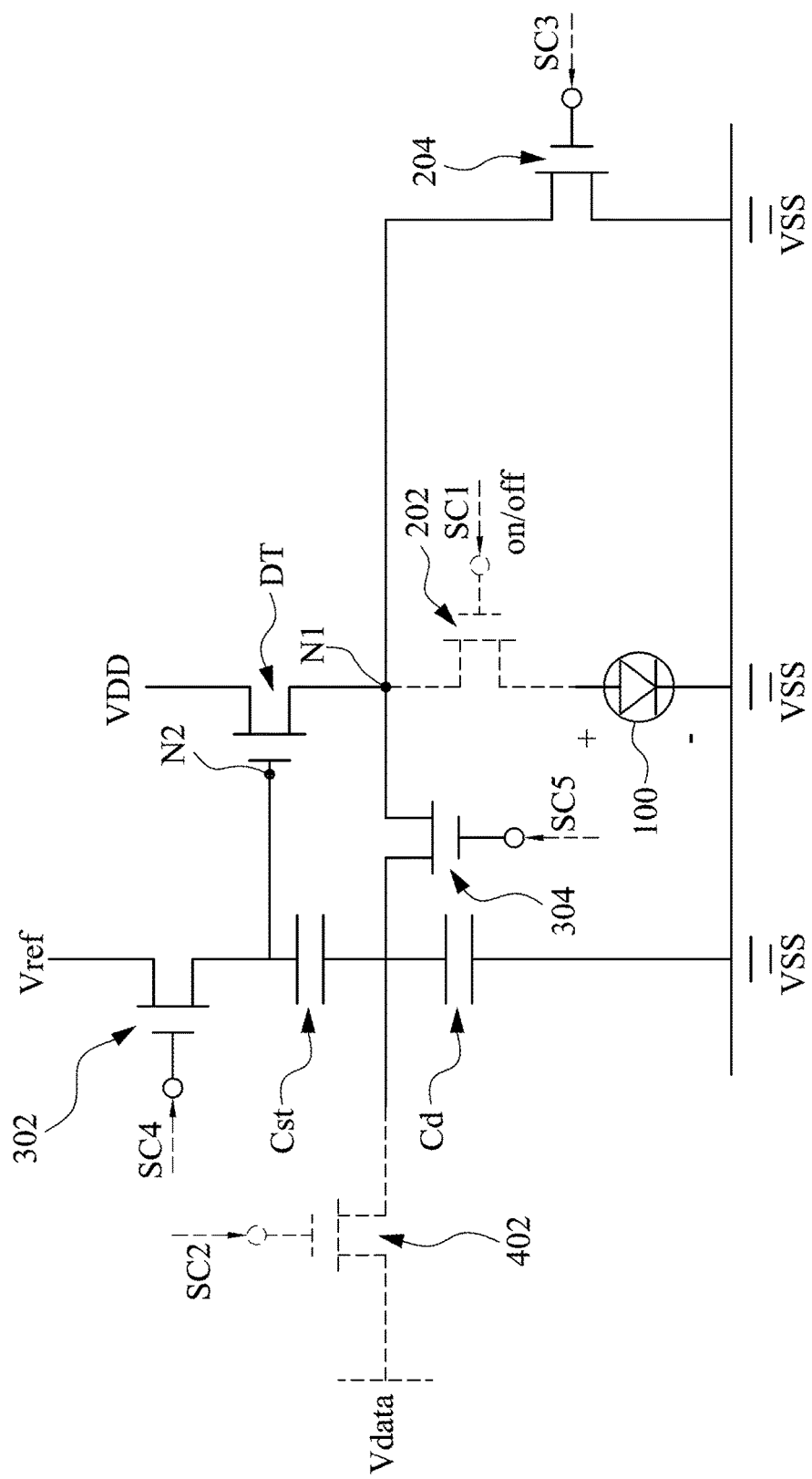
FIG. 13A is the first driving circuit operated during the reset segment according to some embodiments of the present disclosure.
Figure 13B:
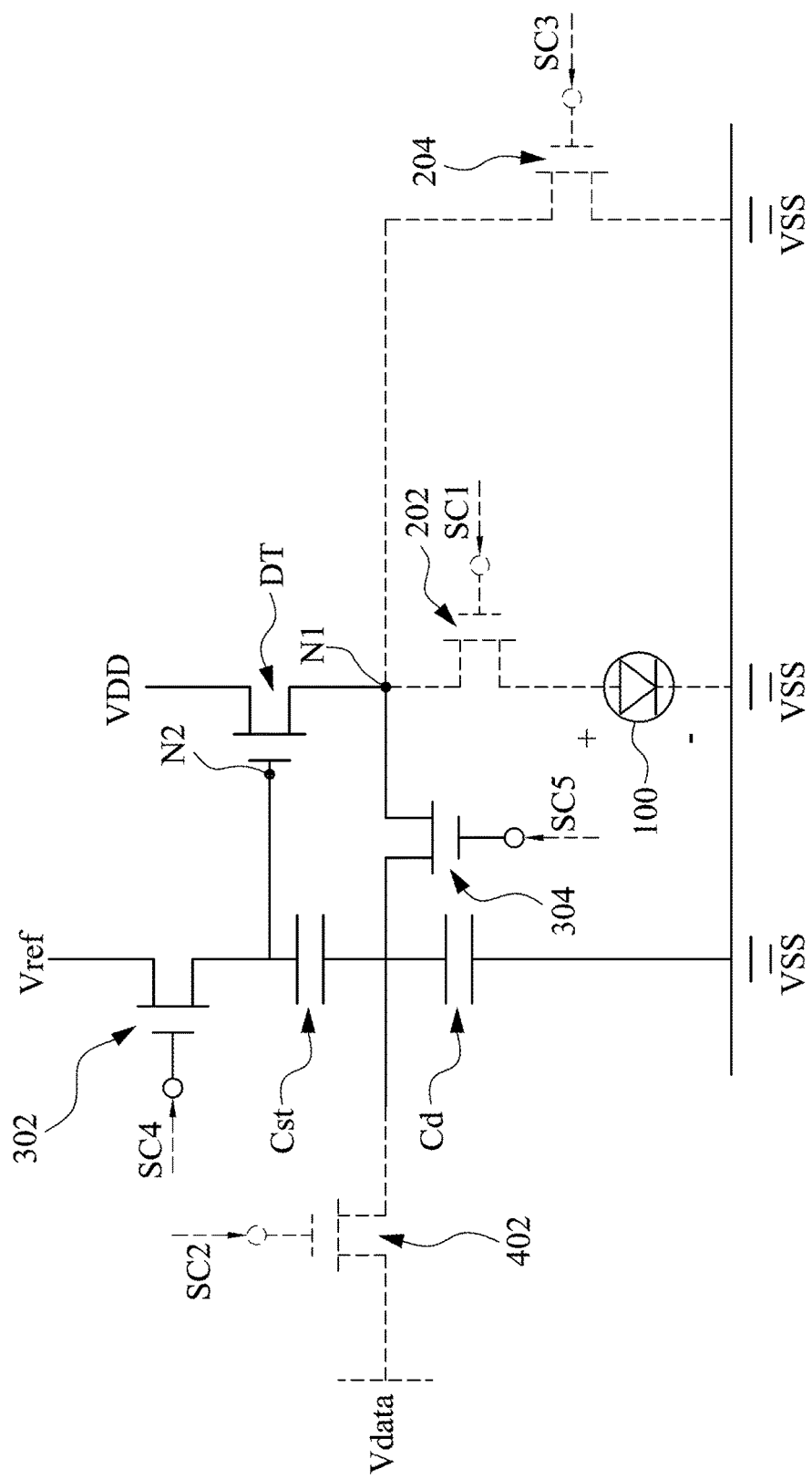
FIG. 13B is the first driving circuit operated during the compensation segment according to some embodiments of the present disclosure.
Figure 13C:
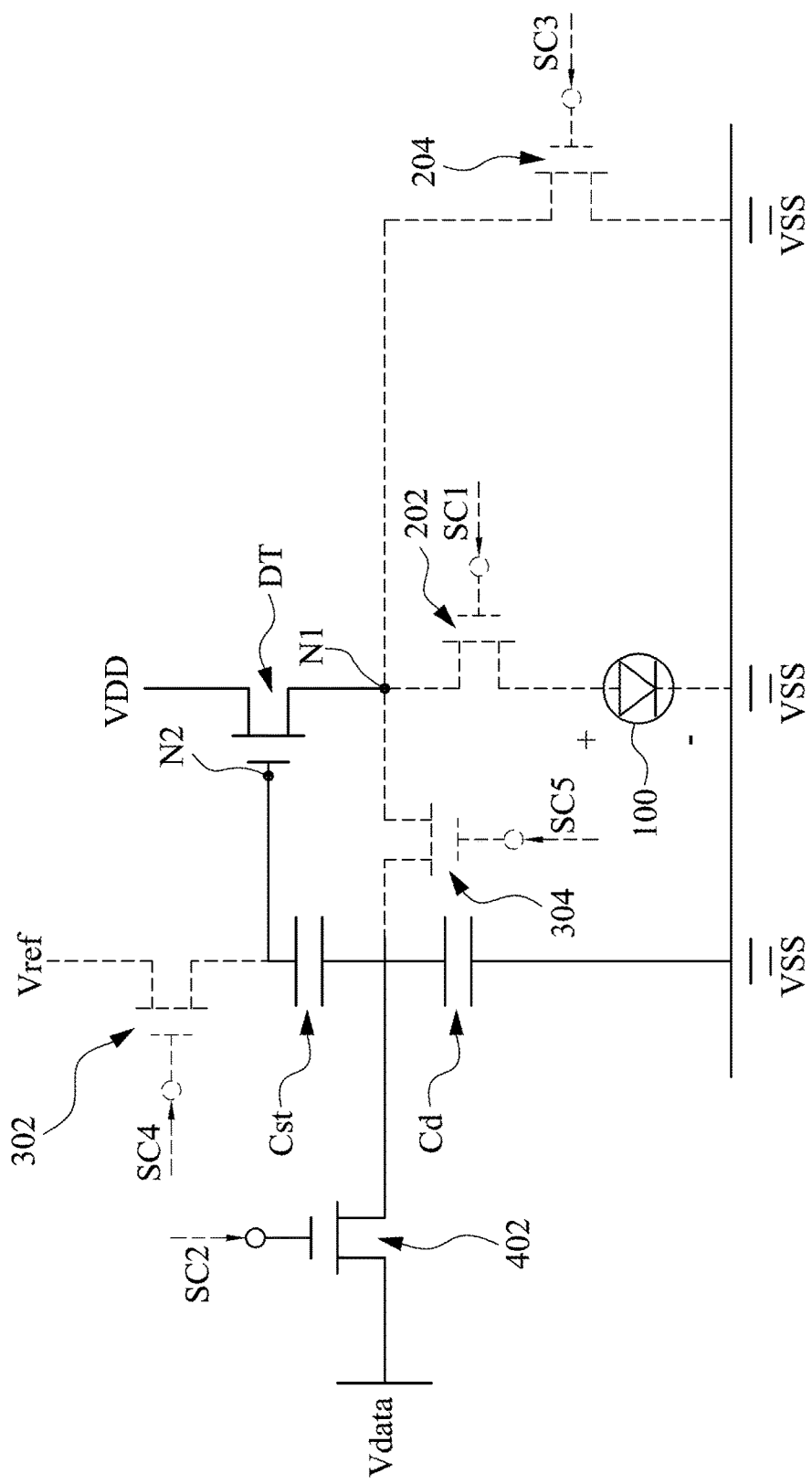
FIG. 13C is the first driving circuit operated during the data input segment according to some embodiments of the present disclosure.
Figure 13D:
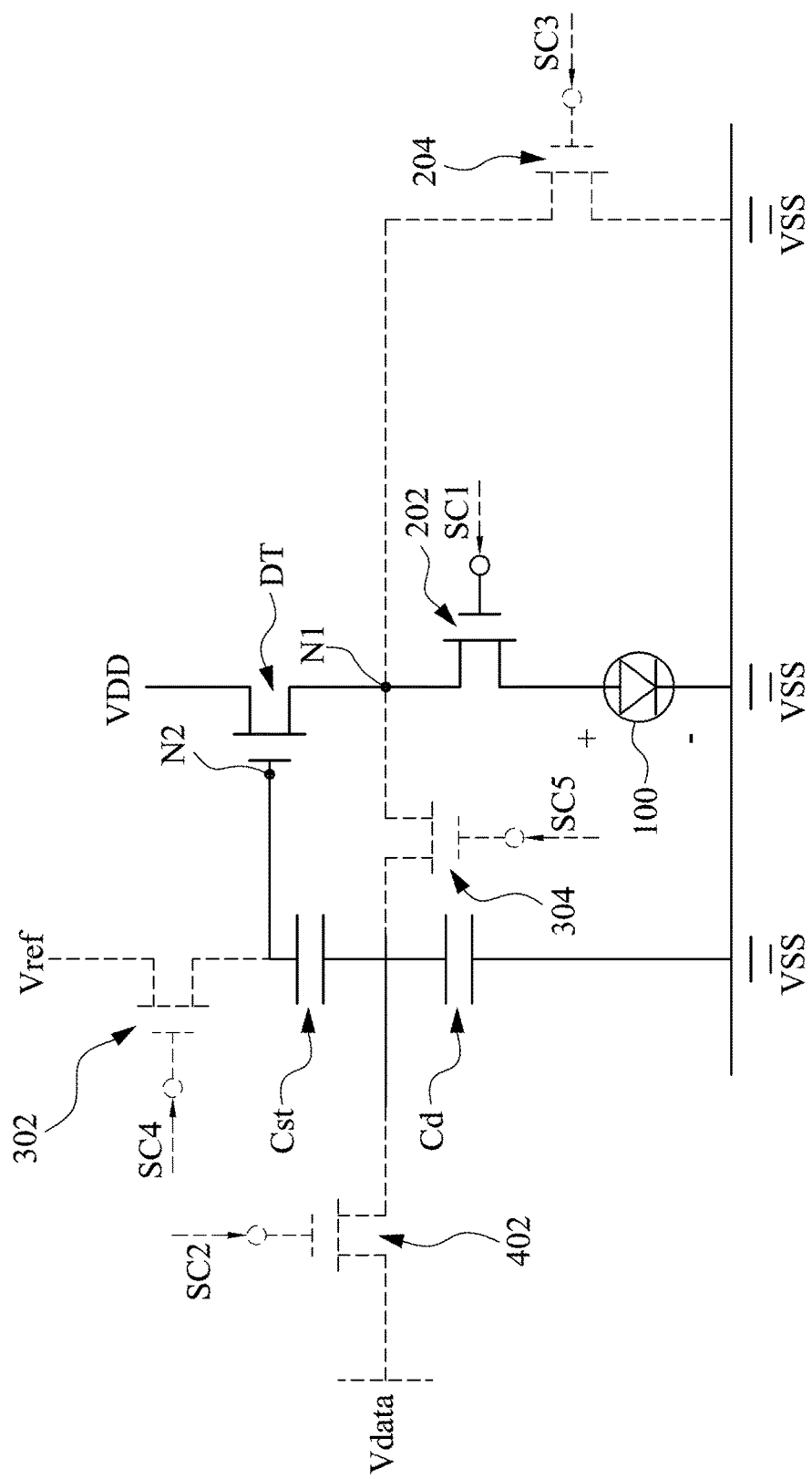
FIG. 13D is the first driving circuit operated during the emission segment according to some embodiments of the present disclosure.

Reference is made to FIGS. 10, 11A, 11B, 12A, 12B and 13A to 13D. FIG. 10 is a schematic diagram of an alternating self-compensation circuit 1-2 including a first driving circuit 1000-2 and a second driving circuit 1000-2' according to some embodiments of the present disclosure. FIG. 11A is a schematic diagram of a first reset circuit 200-2 according to some embodiments of the present disclosure. FIG. 11B is a timing diagram of an operation for the first driving circuit 1000-2 according to some embodiments of the present disclosure. FIG. 12A is a schematic diagram of a second reset circuit 200-2' according to some embodiments of the present disclosure. FIG. 12B is a timing diagram of an operation for the second driving circuit 1000-2' according to some embodiments of the present disclosure. FIG. 13A is the first driving circuit 1000-2 operated during the reset segment RS according to some embodiments of the present disclosure. FIG. 13B is the first driving circuit 1000-2 operated during the compensation segment CS according to some embodiments of the present disclosure. FIG. 13C is the first driving circuit 1000-2 operated during the data input segment DIS according to some embodiments of the present disclosure. FIG. 13D is the first driving circuit 1000-2 operated during the emission segment ES according to some embodiments of the present disclosure. A difference between embodiments as illustrated by FIG. 10 and the embodiments as illustrated by FIG. 6 is that a first reset circuit 200-2 as shown in the embodiments illustrated by FIG. 10 further includes a switching transistor 204 compared to the first reset circuit 200 as shown in the embodiments illustrated by FIG. 6, and a second reset circuit 200-2' as shown in the embodiments illustrated by FIG. 10 further includes a switching transistor 204' compared to the second reset circuit 200' as shown in the embodiments illustrated by FIG. 6. The switching transistor 204 has terminals T11 and T12 and a control terminal C3-2. The terminal T11 is electrically connected to the first node N1. The terminal T12 is electrically connected to the low-level voltage VSS. The control terminal C3-2 is configured to receive a scan signal SC3. During the reset segment RS, as illustrated by FIGS. 11B and 13A, the switching transistor 204 is enabled by the scan signal SC3, such that a voltage level of the first node N1 is equal to the low-level voltage VSS. The switching transistor 202 can be enabled or disabled during the reset segment RS. During the compensation segment CS, as illustrated by FIGS. 11B and 13B, the switching transistor 202 and the switching transistor 204 are disabled respectively by the scan signal SC1 and the scan signal SC3, such that the first node N1 is not electrically connected to the low-level voltage VSS. During the data input segment DIS, as illustrated by FIGS. 11B and 13C, the switching transistor 204 is disabled by the scan signal SC3. During the emission segment ES, as illustrated by FIGS. 11B and 13D, the switching transistor 202 is enabled by the scan signal SC1 and the switching transistor 204 is disabled by the scan signal SC3. During the recovery segment RCS which uses the first reference voltage Vref to recover the threshold voltage shift of the first driving transistor DT, the switching transistor 204 is enabled by the scan signal SC3, and during the recovery segment RCS which uses the first data voltage Vdata to recover the threshold voltage shift of the first driving transistor DT, the switching transistor 204 is also disabled by the scan signal SC3.

The switching transistor 204' has terminals T11' and T12' and a control terminal C3-2'. The terminal T11' is electrically connected to the third node N1'. The terminal T12' is electrically connected to the low-level voltage VSS. The control terminal C3-2' is configured to receive a scan signal SC3'. During the reset segment RS', as illustrated by FIG. 12B, the switching transistor 204' is enabled by the scan signal SC3', such that a voltage level of the third node N1' is equal to the low-level voltage VSS. The switching transistor 202' can be enabled or disabled during the reset segment RS'. During the compensation segment CS', as illustrated by FIG. 12B, the switching transistor 202' and the switching transistor 204' are disabled respectively by the scan signal SC1' and the scan signal SC3', such that the third node N1' is not electrically connected to the low-level voltage VSS. During the data input segment DIS', as illustrated by FIG. 12B, the switching transistor 204' is disabled by the scan signal SC3'. During the emission segment ES', as illustrated by FIG. 12B, the switching transistor 202' is enabled by the scan signal SC1' and the switching transistor 204' is disabled by the scan signal SC3'. During the recovery segment RCS' which uses the second reference voltage Vref' to recover the threshold voltage shift of the second driving transistor DT', the switching transistor 204' is enabled by the scan signal SC3', and during the recovery segment RCS' which uses the second data voltage Vdata' to recover the threshold voltage shift of the second driving transistor DT', the switching transistor 204' is also disabled by the scan signal SC3'.

Since operations of the second driving circuit 1000-2' during the reset segment RS', the compensation segment CS', the data input segment DIS', and the emission segment ES' (and also the recovery segment RCS' and the blank segment BS') is similar to that of the first driving circuit 1000-2, figures for the second driving circuit 1000-2' similar to FIGS. 13A to 13D are omitted herein for simplicity.

Figure 14:
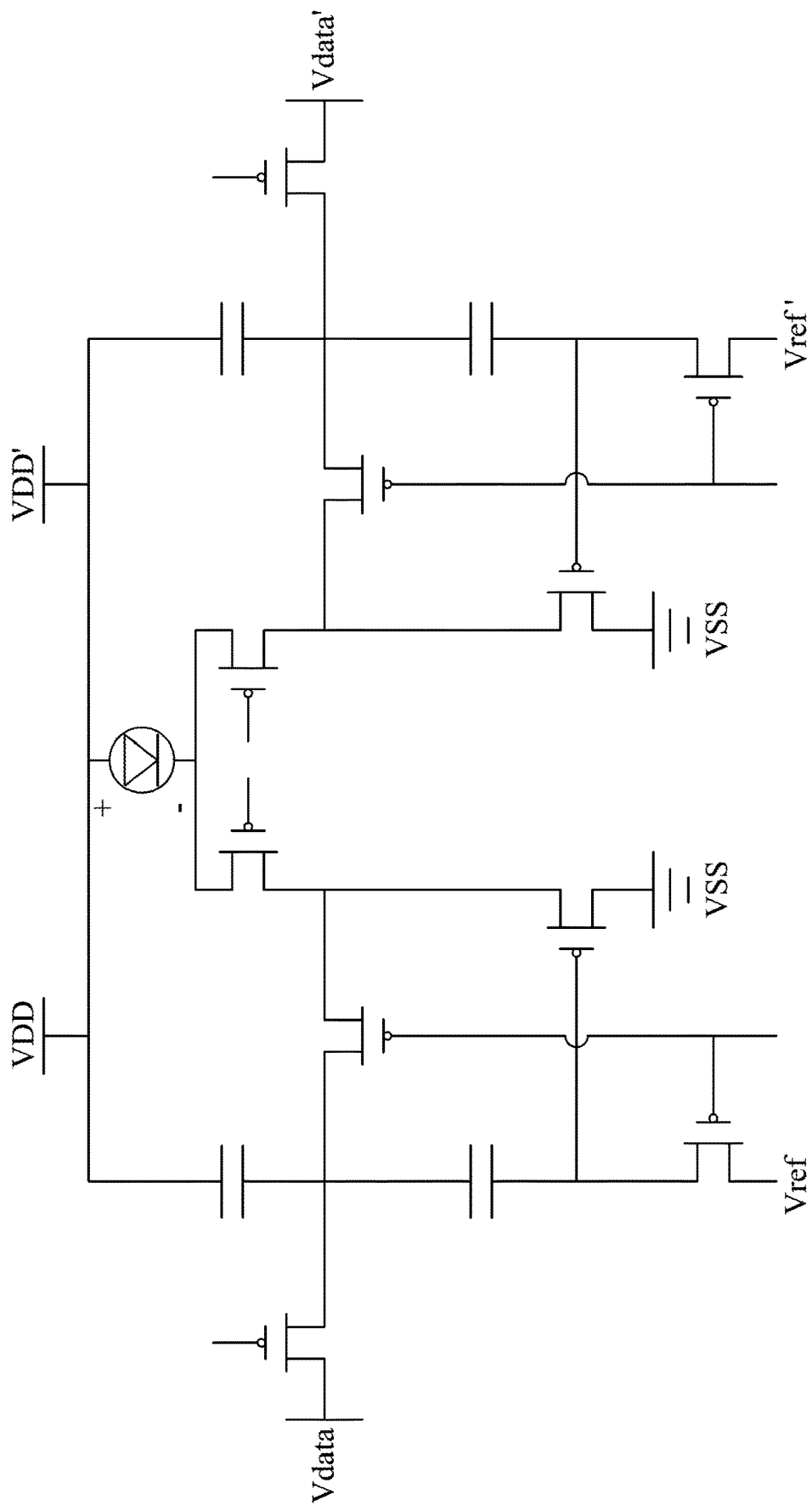
FIG. 14 is a schematic diagram of an alternating self-compensation circuit according to some embodiments of the present disclosure.

Transistors as shown in the above embodiments are n-channel transistors, such as a hydrogenated amorphous silicon (a-Si:H) transistor, an indium gallium zinc oxide (IGZO) transistor, or an n-type metal-oxide-semiconductor field effect transistor (NMOSFET). FIG. 14 is a schematic diagram of an alternating self-compensation circuit 2 according to some embodiments of the present disclosure. In some embodiments, the transistors can be p-channel transistors in some other embodiments, such as a low-temperature poly-silicon (LTPS) transistor. The connection relations among electronic elements of an alternating self-compensation circuit when the transistors are p-channel transistors are substantially reversed as compared to the alternating self-compensation circuit 1-1 and 1-2 and will not be described herein in detail.

In summary, an alternating self-compensation circuit is provided to compensate a threshold voltage shift of driving transistors used to drive a light-emitting device. A precision of controlling brightness in a low grayscale region of the light-emitting device is enhanced. A resolution of the alternating self-compensation circuit can be greatly enhanced since duration for waiting a compensation segment can be technically avoided within the scope of the alternating self-compensation circuit present in the embodiments of the present disclosure. In addition, threshold voltage shifts in both a first driving transistor and a second driving transistor in the alternating self-compensation circuit can be better recovered. Finally, reset circuits are inherently acting as switches to determine which driving circuit is used to driving the light-emitting device at a time, and thus an additional switch in the alternating self-compensation circuit is omitted.

For a better reference between elements described in the description and the claimed elements, an embodiment showing one possible correspondence is shown below. However, it should not be limited thereto. In one embodiment, switching transistors 202, 204, 302, 304, 402, 202', 204', 302', 304', and 402' in the description are respectively corresponding to first, second, third, fourth, fifth, sixth, seventh, eighth, ninth, and tenth switching transistors as claimed; and scan signals SC1, SC3, SC4, SC5, SC2, SC1', SC3', SC4', SC5', and SC2' in the description are respectively corresponding to first, second, third, fourth, fifth, sixth, seventh, eighth, ninth, and tenth scan signals as claimed. The above correspondence is merely for easy to read, and should not be viewed as limitations for the claimed disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An alternating self-compensation circuit comprising:
   a light-emitting device;
   a first driving circuit configured to drive the light-emitting device during a first time period, the first driving circuit comprising:
   a first delivery capacitor electrically connected to a low-level voltage;
   a first driving transistor configured to drive the light-emitting device according to a first driving voltage received from a first driving voltage line, wherein the first driving voltage is higher than the low-level voltage;
   a first reset circuit electrically connected to the first driving transistor through a first node, electrically connected to the light-emitting diode, and configured to determine whether to electrically connect the light-emitting device to the first node;
   a first compensation circuit electrically connected to the first node and the first delivery capacitor and configured to receive a first reference signal higher than the low-level voltage and to control a gate voltage of the first driving transistor through a second node;
   a first data circuit configured to receive a first data voltage, and to determine whether to electrically connect the first data voltage to the first compensation circuit and whether to electrically connect the first data voltage to the first delivery capacitor; and
   a second driving circuit configured to drive the light-emitting device during a second time period, the second driving circuit comprising:
   a second delivery capacitor electrically connected to the low-level voltage;
   a second driving transistor configured to drive the light-emitting device according to a second driving voltage received from a second driving voltage line, wherein the second driving voltage is higher than the low-level voltage;
   a second reset circuit electrically connected to the second driving transistor through a third node, electrically connected to the light-emitting diode, and configured to determine whether to electrically connect the light-emitting device to the third node;
   a second compensation circuit electrically connected to a fourth node and the second delivery capacitor and configured to receive a second reference signal higher than the low-level voltage and to control a gate voltage of the second driving transistor through the fourth node;
   a second data circuit configured to receive a second data voltage, and to determine whether to electrically connect the second data voltage to the second compensation circuit and whether to electrically connect the second data voltage to the second delivery capacitor,
   wherein the first driving circuit and the second driving circuit are electrically and separately connected to one of two ends of the light-emitting device, and the first time period and the second time period are at least partially overlapped in time.

2. The alternating self-compensation circuit of claim 1, wherein
   the first time period comprises:
      a first pre-emission time segment comprising a first blank segment, a first recovery segment, a first reset segment, a first compensation segment, a first data input segment, or combinations thereof; and
      a first emission time segment; and
   the second time period comprises:
      a second pre-emission time segment comprising a second blank segment, a second recovery segment, a second reset segment, a second compensation segment, a second data input segment, or combinations thereof; and
      a second emission time segment,
   wherein the first emission time segment does not overlap with the second emission time segment.

3. The alternating self-compensation circuit of claim 2, wherein the first reset circuit comprises:
a first switching transistor having a first terminal electrically connected to the first driving transistor through the first node, a second terminal electrically connected to the light-emitting device, and a control terminal configured to receive a first scan signal.

4. The alternating self-compensation circuit of claim 3, wherein
during the first reset segment and the first emission segment, the first switching transistor is enabled by the first scan signal, and
during the first compensation segment, the first switching transistor is disabled by the first scan signal.

5. The alternating self-compensation circuit of claim 3, wherein
during the first recovery segment, the first switching transistor is enabled by the first scan signal.

6. The alternating self-compensation circuit of claim 3, wherein
during the first recovery segment, the first switching transistor is disabled by the first scan signal.

7. The alternating self-compensation circuit of claim 3, wherein the first reset circuit further comprises:
a second switching transistor having a first terminal electrically connected to the first node, a second terminal electrically connected to the low-level voltage, and a control terminal configured to receive the second scan signal.

8. The alternating self-compensation circuit of claim 7, wherein
during the first reset segment, the second switching transistor is enabled by the second scan signal,
during the first compensation segment, the first switching transistor and the second switching transistor are disabled respectively by the first scan signal and the second scan signal, and
during the first emission segment, the first switching transistor is enabled by the first scan signal and the second switching transistor is disabled by the second scan signal.

9. The alternating self-compensation circuit of claim 2, wherein the first compensation circuit comprises:
a first storage capacitor having a first end and a second end;
a third switching transistor having a first terminal electrically connected to the first reference signal, a second terminal electrically connected to the first end of the first storage capacitor and the second node, and a control terminal configured to receive a third scan signal; and
a fourth switching transistor having a first terminal electrically connected to the second end of the first storage capacitor and the first delivery capacitor (Cd), a second terminal electrically connected to the first node, and a control terminal configured to receive a fourth scan signal.

10. The alternating self-compensation circuit of claim 9, wherein
during the first reset segment and the first compensation segment, the third switching transistor and the fourth switching transistor are enabled respectively by the third scan signal and the fourth scan signal;
during the first data input segment, the third switching transistor is disabled by the third scan signal; and
during the first emission segment, the third switching transistor and the fourth switching transistor are disabled respectively by the third scan signal and the fourth scan signal.

11. The alternating self-compensation circuit of claim 10, wherein the third scan signal and the fourth scan signal are the same scan signal.

12. The alternating self-compensation circuit of claim 2, wherein the first data circuit comprises:
a fifth switching transistor having a first terminal electrically connected to the first data voltage, a second terminal electrically connected to the first compensation circuit and the first delivery capacitor, and a control terminal configured to receive a fifth scan signal.

13. The alternating self-compensation circuit of claim 12, wherein during the first reset segment, the first compensation segment, and the first emission segment, the fifth switching transistor is disabled by the fifth scan signal, and during the first data input segment, the fifth switching transistor is enabled by the fifth scan signal.

14. The alternating self-compensation circuit of claim 2, wherein the second reset circuit comprises:
a sixth switching transistor having a first terminal electrically connected to the second driving transistor through a third node, a second terminal electrically connected to the light-emitting diode, and a control terminal configured to receive a sixth scan signal.

15. The alternating self-compensation circuit of claim 14, wherein
during the second reset segment and the second emission segment, the sixth switching transistor is enabled by the sixth scan signal, and
during the second compensation segment, the sixth switching transistor is disabled by the sixth scan signal.

16. The alternating self-compensation circuit of claim 14, wherein during the second recovery segment, the sixth switching transistor is enabled by the sixth scan signal.

17. The alternating self-compensation circuit of claim 14, wherein during the second recovery segment, the sixth switching transistor is disabled by the sixth scan signal.

18. The alternating self-compensation circuit of claim 14, wherein the second reset circuit further comprises:
a seventh switching transistor having a first terminal electrically connected to the third node, a second terminal electrically connected to the low-level voltage, and a control terminal configured to receive the seventh scan signal.

19. The alternating self-compensation circuit of claim 18, wherein
during the second reset segment, the seventh switching transistor is enabled by the seventh scan signal,
during the second compensation segment, the sixth switching transistor and the seventh switching transistor are disabled respectively by the sixth scan signal and the seventh scan signal, and
during the second emission segment, the sixth switching transistor is enabled by the sixth scan signal and the seventh switching transistor is disabled by the seventh scan signal.

20. The alternating self-compensation circuit of claim 2, wherein the second compensation circuit comprises:
a second storage capacitor having a first end and a second end;
an eighth switching transistor having a first terminal electrically connected to the second reference signal, a second terminal electrically connected to the first end of the second storage capacitor and the fourth node, and a control terminal configured to receive an eighth scan signal; and a ninth switching transistor having a first terminal electrically connected to the second end of the second storage capacitor and the second delivery capacitor, a second terminal electrically connected to the third node, and a control terminal configured to receive a ninth scan signal.

21. The alternating self-compensation circuit of claim 20, wherein during the second reset segment and the second compensation segment, the eighth switching transistor and the ninth switching transistor are enabled respectively by the eighth scan signal and the ninth scan signal, during the second data input segment, the eighth switching transistor is disabled by the eighth scan signal; and during the second emission segment, the eighth switching transistor and the ninth switching transistor are disabled respectively by the eighth scan signal and the ninth scan signal.

22. The alternating self-compensation circuit of claim 21, wherein the eighth scan signal and the ninth scan signal are the same scan signal.

23. The alternating self-compensation circuit of claim 2, wherein the second data circuit comprises:

a tenth switching transistor having a first terminal electrically connected to the second data voltage, a second terminal electrically connected to the second compensation circuit and the second delivery capacitor, and a control terminal configured to receive a tenth scan signal.

24. The alternating self-compensation circuit of claim 23, wherein during the second reset segment, the second compensation segment, and the second emission segment, the tenth switching transistor (402') is disabled by the tenth scan signal, and during the second data input segment, the tenth switching transistor is enabled by the tenth scan signal.

25. The alternating self-compensation circuit of claim 2, wherein during the first emission segment, the first data circuit and the first compensation circuit are disabled and the first reset circuit is enabled, such that the light-emitting device is driven according to the first driving voltage and the gate voltage applied to the first driving transistor via the first compensation circuit, and during the second emission segment, the second data circuit and the second compensation circuit are disabled and the second reset circuit is enabled, such that the light-emitting device is driven according to the second driving voltage and the gate voltage applied to the second driving transistor via the second compensation circuit.

26. The alternating self-compensation circuit of claim 2, wherein during the first reset segment, the first data circuit is disabled and the first reset circuit and the first compensation circuit are enabled, such that the first data voltage is not applied to the first driving transistor and a voltage difference between the second node and the first node is greater than a threshold voltage of the first driving transistor, and during the second reset segment, the second data circuit is disabled and the second reset circuit and the second compensation circuit are enabled, such that the second data voltage is not applied to the second driving transistor and a voltage difference between the fourth node and the third node is greater than a threshold voltage of the second driving transistor.

27. The alternating self-compensation circuit of claim 2, wherein during the first compensation segment, the first data circuit and the first reset circuit are disabled and the first compensation circuit is enabled, such that a voltage level of the first node is gradually increased until a voltage difference between the second node and the first node (N1) approaches a threshold voltage of the first driving transistor, and during the second compensation segment, the second data circuit and the second reset circuit are disabled and the second compensation circuit is enabled, such that a voltage level of the third node is gradually increased until a voltage difference between the fourth node and the third node approaches a threshold voltage of the second driving transistor.

28. The alternating self-compensation circuit of claim 2, wherein during the first data input segment, the first reset circuit and the first compensation circuit are disabled and the first data circuit is enabled, such that the first data voltage and a threshold voltage of the first driving transistor are combined and applied to the first driving transistor through the first delivery capacitor and the first compensation circuit, and during the second data input segment, the second reset circuit and the second compensation circuit are disabled and the second data circuit (400') is enabled, such that the second data voltage and a threshold voltage of the second driving transistor are combined and applied to the second driving transistor through the second delivery capacitor (Cd') and the second compensation circuit.

29. The alternating self-compensation circuit of claim 2, wherein during the first recovery segment, the first reference voltage or the first data voltage having a voltage level lower than a sum of the low-level voltage, a threshold voltage of the first driving transistor, and a voltage difference between two ends of the light-emitting device is applied to control the gate voltage of the first driving transistor, such that a threshold voltage shift of the first driving transistor during the first emission segment is recovered, and during the second recovery segment, the second reference voltage or the second data voltage having a voltage level lower than a sum of the low-level voltage and a threshold voltage of the second driving transistor, and a voltage difference between two ends of the light-emitting device is applied to control the gate voltage of the second driving transistor, such that a threshold voltage shift of the second driving transistor during the second emission segment is recovered.

30. The alternating self-compensation circuit of claim 2, wherein the first pre-emission time segment is overlapped with the second emission time segment, and the second pre-emission time segment is overlapped with the first emission time segment.

31. The alternating self-compensation circuit of claim 2, wherein the first pre-emission time segment and the first emission time segment are repeated alternately in sequence, and the second pre-emission time segment and the second emission time segment are repeated alternately in sequence.

32. The alternating self-compensation circuit of claim 2, wherein the first emission time segment and the second emission time segment are repeated alternately in sequence.

* * * * *